(12) United States Patent
Michishita

(10) Patent No.: US 12,052,013 B2
(45) Date of Patent: Jul. 30, 2024

(54) GATE DRIVE DEVICE

(71) Applicant: DENSO CORPORATION, Kariya (JP)

(72) Inventor: Yusuke Michishita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 18/157,941

(22) Filed: Jan. 23, 2023

(65) Prior Publication Data

US 2023/0163758 A1   May 25, 2023

Related U.S. Application Data

(63) Continuation of application No. PCT/JP2021/040385, filed on Nov. 2, 2021.

(30) Foreign Application Priority Data

Nov. 27, 2020   (JP) .................................. 2020-197004

(51) Int. Cl.
*H03K 17/0812* (2006.01)
*H03K 17/16* (2006.01)

(52) U.S. Cl.
CPC ..... *H03K 17/08128* (2013.01); *H03K 17/168* (2013.01)

(58) Field of Classification Search
CPC .. H03K 17/168; H03K 17/161; H03K 17/163; H03K 17/01822
See application file for complete search history.

(56) References Cited

U.S. PATENT DOCUMENTS

| 10,469,057 | B1 * | 11/2019 | Frank | ................. H03K 17/0412 |
| 2005/0206438 | A1 | 9/2005 | Higashi | |
| 2012/0032710 | A1 | 2/2012 | Tsukada | |
| 2020/0036374 | A1 * | 1/2020 | Akahane | ............ H03K 17/0828 |
| 2020/0127657 | A1 * | 4/2020 | Masuhara | ............... H02M 1/08 |

FOREIGN PATENT DOCUMENTS

| JP | 4935266 B2 | 5/2012 |
| JP | 6350301 B2 | 7/2018 |
| JP | 6848936 B2 * | 3/2021 |

* cited by examiner

*Primary Examiner* — Patrick C Chen
(74) *Attorney, Agent, or Firm* — Posz Law Group, PLC

(57) ABSTRACT

A gate drive device for driving a switching element includes: a gate drive circuit that drives a gate of the switching element based on a gate drive signal and a drive performance adjustment signal; a gate voltage detection circuit that outputs an on detection signal or an off detection signal when detecting that a gate voltage of the switching element reaches an on determination set value or an off determination set value; and a control circuit that outputs the drive performance adjustment signal to the gate drive circuit to match a gate drive time with a predetermined gate drive time set value.

9 Claims, 17 Drawing Sheets

GATE DRIVE DEVICE

CROSS REFERENCE TO RELATED APPLICATIONS

The present application is a continuation application of International Patent Application No. PCT/JP2021/040385 filed on Nov. 2, 2021, which designated the U.S. and claims the benefit of priority from Japanese Patent Application No. 2020-197004 filed on Nov. 27, 2020. The entire disclosures of all of the above applications are incorporated herein by reference.

TECHNICAL FIELD

The present disclosure relates to a gate drive device.

BACKGROUND

In the gate drive control of a gate-driven switching element, when the gate is driven with a predetermined drive performance, the following difficulties may arise due to variations in the gate capacitance of the switching element as a control target.

Since the switching elements have different gate capacities, when they are driven with the set drive performance, the gate voltages may be different from each other even if the gate charge Qg is the same, and this may cause variations in the ON or OFF gate drive time.

Therefore, in the switching element in the power system, since the surge voltages generated during switching also vary, it is necessary to determine the drive performance in view of the variation so that the surge voltage does not exceed the withstand voltage of the switching element.

Specifically, since there are variations in the characteristics of the switching elements, the drive performance is adjusted while observing the surge voltage in accordance with the minimum value of the standard corresponding to the gate capacitance or the gate capacitance. As a result, even if there are variations in the characteristics of the switching elements as the control target, the surge voltage can be suppressed from exceeding the withstand voltage. However, there may be a difficulty that the switching loss increases.

SUMMARY

According to an example, a gate drive device for driving a switching element may include: a gate drive circuit that drives a gate of the switching element based on a gate drive signal and a drive performance adjustment signal; a gate voltage detection circuit that outputs an on detection signal or an off detection signal when detecting that a gate voltage of the switching element reaches an on determination set value or an off determination set value; and a control circuit that outputs the drive performance adjustment signal to the gate drive circuit to match a gate drive time with a predetermined gate drive time set value.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The present embodiments provides a gate drive device for driving a plurality of switching elements within an on-drive time set in consideration of a reduction effect of a switching loss and with a surge voltage not exceeding a withstand voltage even if gate capacitances of the switching elements as a control target are different from each other due to a variation thereof.

The gate drive device according to the present embodiments that drives at least one gate-driven switching element, the gate drive device includes: at least one gate drive circuit that drives at least one gate of the at least one gate-driven switching element based on a gate drive signal and a drive performance adjustment signal for setting a gate drive performance; at least one gate voltage detection circuit that outputs an on detection signal or an off detection signal when detecting that a gate voltage of the at least one switching element reaches an on determination set value or an off determination set value; and at least one control circuit that outputs the drive performance adjustment signal to the at least one gate drive circuit to match a gate drive time, from when instructing an on drive or an off drive of the gate with the gate drive signal to when outputting a detection signal of the on drive or the off drive from the at least one gate voltage detection circuit, with a predetermined gate drive time set value.

By adopting the above configuration, the gate voltage of the switching element is detected by the gate voltage detection circuit with respect to the given gate drive time set value, so that the gate drive time of the on drive or the off drive is monitored. Further, the drive performance is adjusted and set by the control circuit, so that the current value of energizing the gate of the switching element with a constant current is controlled by the gate drive circuit, and the gate drive time is controlled to be the predetermined gate drive set value.

As a result, it is possible to appropriately set the drive performance so as to minimize variations in the gate drive time due to variations in the gate capacitance of the switching element with respect to the on drive time set value that is set preliminarily. Thus, it is possible to prevent the surge voltage from exceeding the withstand voltage, to maintain the gate voltage drive time appropriately and to prevent the switching loss from increasing.

First Embodiment

The description below explains a first embodiment of the present disclosure with reference to FIGS. 1 through 4.

Figure 1:
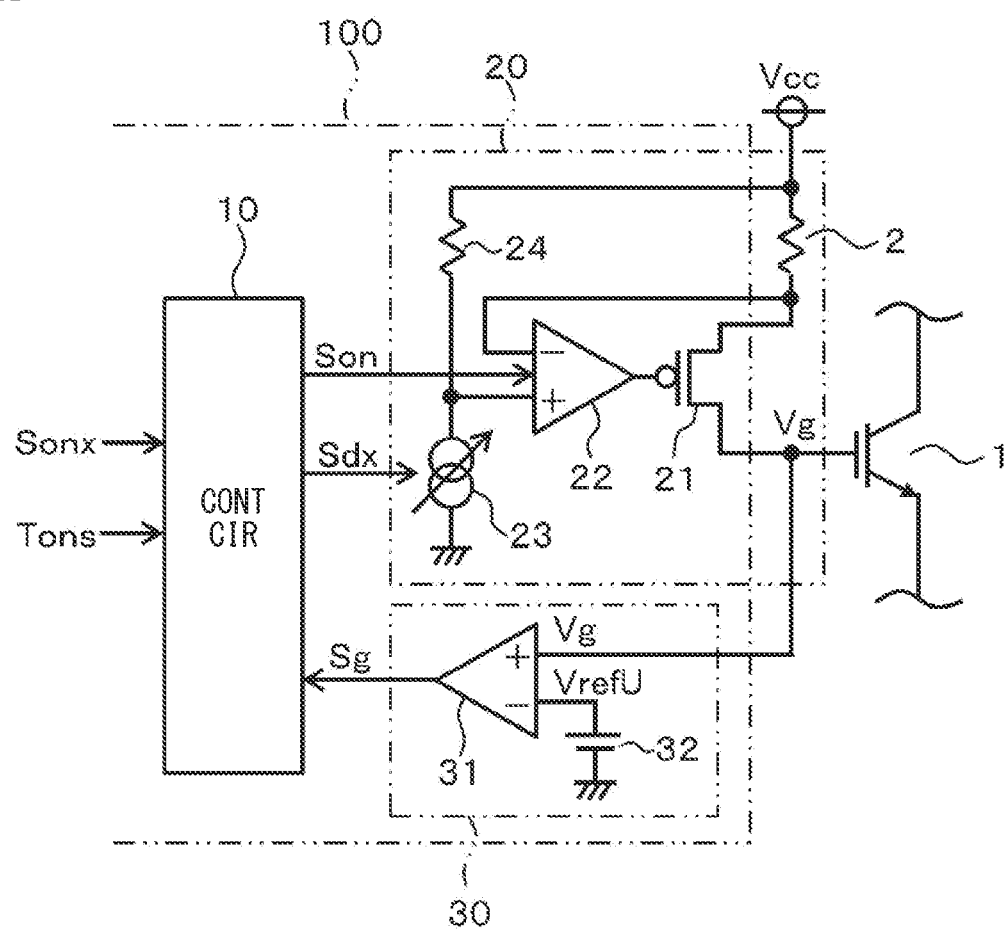
FIG. 1 is a diagram showing an electric configuration according to a first embodiment.

FIG. 1 shows an electrical configuration, and a gate drive device 100 performs on/off drive control of, for example, an IGBT (Insulated Gate Bipolar Transistor) 1, which is a gate-driven switching element as a control target. In this embodiment, the configuration provides performing an on-drive control. An off-drive circuit for performing an off-drive of the IGBT 1 is not shown in FIG. 1, but may be provided in the gate drive device 100 or may be provided separately.

The gate drive device 100 includes a control circuit 10, a gate drive circuit 20 for performing the on-drive, and a gate voltage detection circuit 30. The control circuit 10 receives an on-driving command signal Sonx from an external circuit for controlling on/off control of the IGBT 1 and is input an on-drive time set value Tons. The control circuit 10 outputs an on-drive signal Son to the on-drive circuit 20 in accordance with the supplied on-drive command signal Sonx, and outputs a drive performance voltage signal Sdx in accordance with the on-drive time set value Tons. The control circuit 10 also receives a gate detection signal Sg from the gate voltage detection circuit 30.

The gate drive circuit 20 includes a P-channel MOS transistor 21 for gate drive, an error amplifier 22 and a constant current circuit 23. The MOS transistor 21 has a source connected to the DC power supply Vcc for control through the resistor 2 and a drain connected to the gate of the IGBT 1. A gate of the MOS transistor 21 is connected to an output terminal of the error amplifier 22.

The error amplifier 22 has an inverting input terminal connected to the source of the MOS transistor 21 and a non-inverting input terminal connected to the DC power supply Vcc through the resistor 24 and to the constant current circuit 23. The constant current circuit 23 is configured such that the constant current value is changed and set by the drive performance adjustment signal Sdx, and is configured to adjust the voltage applied to the non-inverting input terminal of the error amplifier 22 by flowing a constant current to the resistor 24.

The error amplifier 22 outputs the voltage to the gate of the MOS transistor 21 to match the voltage, obtained by reducing the voltage generated in the resistor 24 with flowing the constant current of the constant current circuit 23 from the voltage of the DC power supply Vcc, with the voltage obtained by reducing the voltage generated with flowing the current in the resistor 2 from the voltage of the DC power supply Vcc. Thereby, the current flowing through the MOS transistor 21 is controlled to be a constant current. The constant current value that flows through the gate of the IGBT 1 by the MOS transistor 21 can be changed by adjusting the drive performance adjustment signal Sdx.

The gate voltage detection circuit 30 has a comparator 31 and a reference power supply 32. The comparator 31 has a non-inverting input terminal connected to the gate of the IGBT 1 and an inverting input terminal connected to the reference power supply 32. The reference power supply 32 is set to a voltage slightly lower than the gate voltage VG when the IGBT 1 is turned on as the reference voltage VrefU, and the comparator 31 outputs the gate detection signal Sg with the high level to the control circuit 10 when the gate voltage Vg of the IGBT 1 reaches the reference voltage VrefU.

Figure 3:
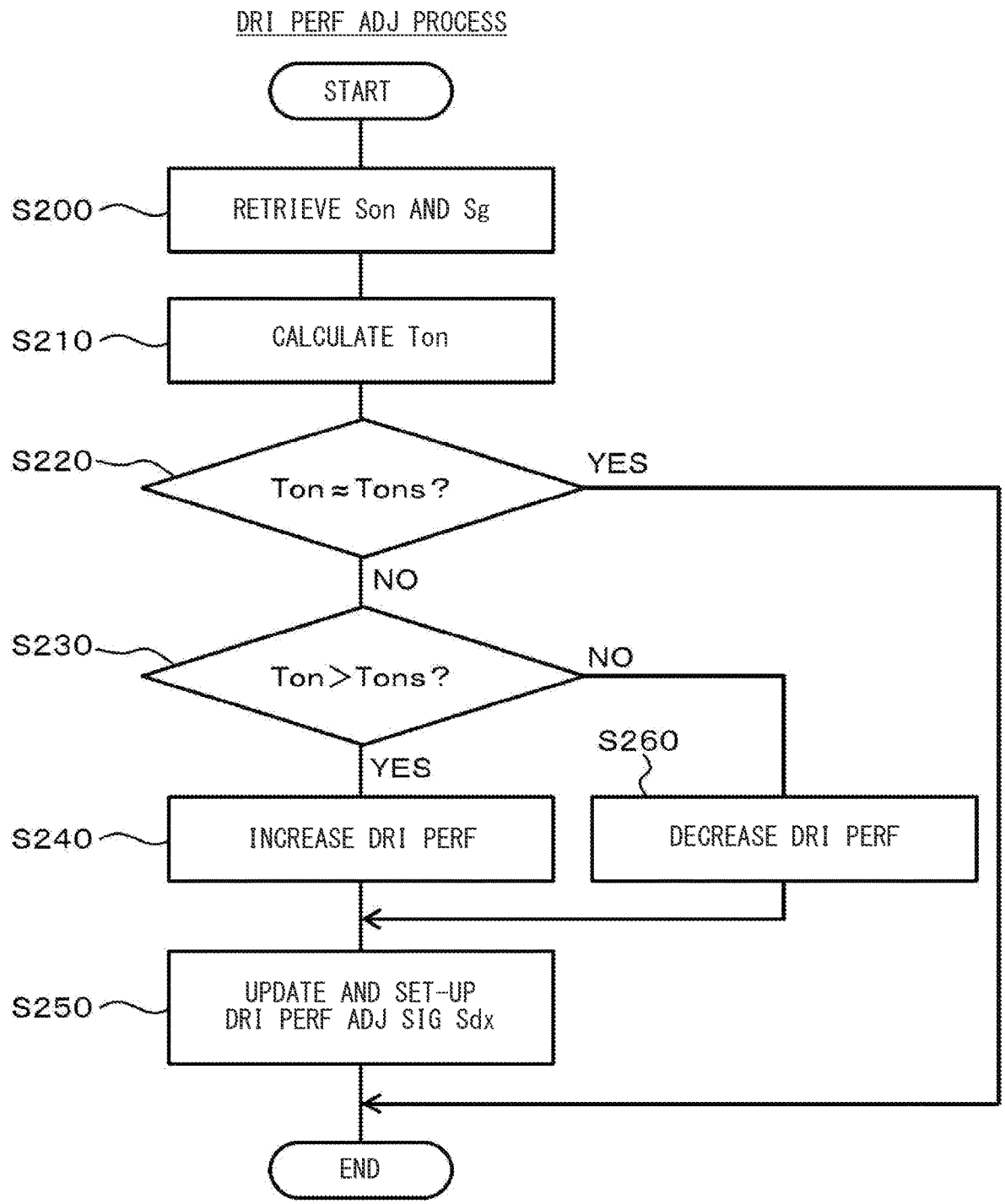
FIG. 3 is a flow chart of an on drive time set process according to the first embodiment.
Figure 4:
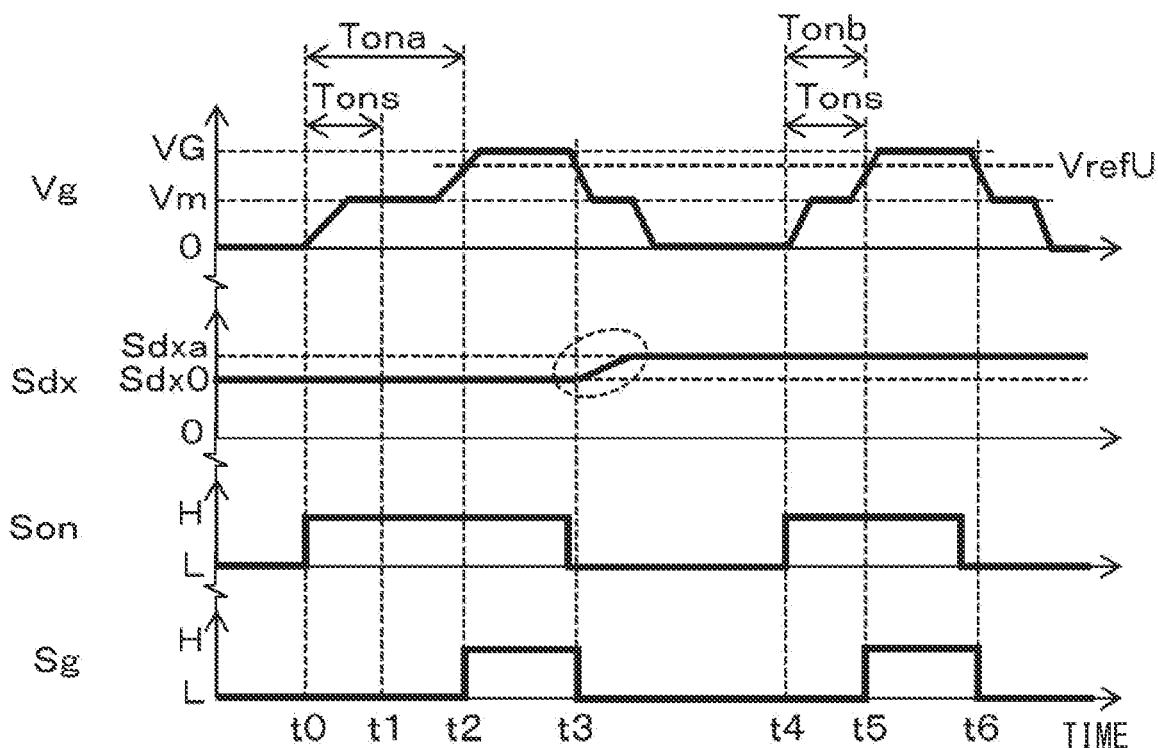
FIG. 4 is a timing chart according to the first embodiment.

Next, operation of the above-mentioned configuration will be described also with reference to FIG. 2 to FIG. 4. In this embodiment, the gate drive device 10 controls the on-drive of the IGBT 1 so that the on-drive time Ton as the gate drive time approaches the on-driving time set value Tons. In this case, the gate capacitance of the IGBT 1 as the control target varies within the standard range. Therefore, when the gate is driven with a constant current, the gate voltage Vg varies even if the gate charge Qg is the same. Thus, the on-drive time Ton is controlled to approach the on-driving time set value Tons by adjusting and setting the constant current using the drive performance Sdx.

Figure 2:
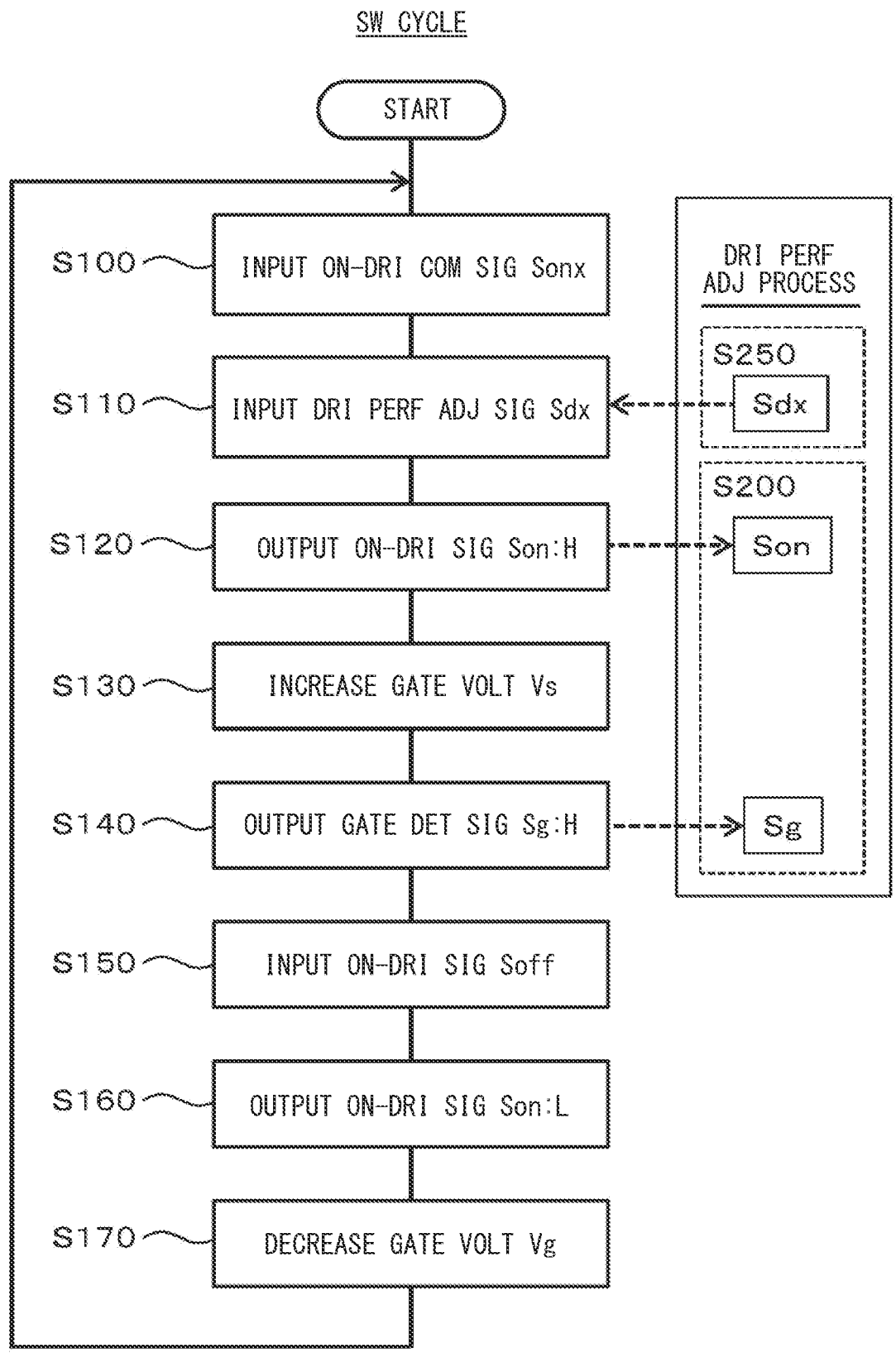
FIG. 2 is a flow diagram of a switching cycle according to the first embodiment.

FIG. 2 shows the switching cycle flow of the on drive control operation of the IGBT 1 by the gate control device 100. First, in step S100, when the on-drive command signal Sonx is given from the external circuit, the control circuit 10 inputs the signal Sonx, and then in step S110, if the drive performance adjustment signal Sdx has been updated, the control circuit 10 inputs the signal Sdx, and output to the gate drive circuit 20. If the drive performance adjustment signal Sdx has not been updated, the previous value or the initial value is set.

Next, at step 120, the control circuit 10 outputs the on drive signal Son with the high level "H" to the gate drive circuit 20 to flow the gate current through the IGBT 1. Here, in the gate drive circuit 20, when the on drive signal Son is given to the error amplifier 22, the constant current set in the constant current circuit 23 flows from the DC power supply Vcc to the resistor 24, and the voltage obtained by reducing the voltage between both ends of the resistor 24 from the power supply voltage Vcc is applied to the non-inverting input terminal of the error amplifier 22. The error amplifier 22 applies a gate voltage to the MOS transistor 21 so that the voltage of the inverting input terminal approaches the same voltage as the voltage drop of the resistor 24 and causes a constant current to flow through the resistor 2.

As a result, the gate of IGBT 1 is charged with a constant current, and in step S130, when the gate voltage Vg rises at a constant rate of voltage increase and reaches a predetermined gate voltage VG, the IGBT 1 is turned on. At this time, the gate voltage Vg of the IGBT 1 has been detected by the gate voltage detection circuit 30, and the comparator 31 outputs to the control circuit 10 in step S140 that it has reached the on state according to the gate detection signal Sg with the high level "H" when the gate voltage Vg has reached the reference voltage VrefU for detecting that the gate voltage Vg has almost reached the predetermined gate voltage VG.

After that, in step S150, when an on drive command signal is given from the external circuit, the control circuit 10 inputs the signal, and in step S160, outputs an off drive signal with a low level "L" to the gate drive circuit 20 to discharge the gate charge of the IGBT 1. As a result, in step S170, the gate voltage Vg of the IGBT 1 decreases, and when it decreases below the threshold voltage, the IGBT 1 shifts to the off state.

Thereafter, by repeating the switching cycle in the same manner as described above, the gate control device 100 controls the on/off drive of the IGBT 1.

Next, in the switching cycle, the flow of the setting process of the on drive time will be described with reference to FIG. 3. In this embodiment, in order to turn on the IGBT 1 with the given on-drive time set value Tons in the above-described switching cycle, the control circuit 10 adjusts the drive performance and sets the drive performance adjustment signal Sdx.

When the control circuit 10 starts the on/off drive control operation, first, in step S200, the timing of the on drive signal Son output in step S120 and the detection timing of the gate detection signal Sg output in step S140 described above are obtained. At S210, the time difference between these timings is calculated as the on drive time Ton.

After that, in step S220, the control circuit 10 determines whether or not the calculated value of the on-drive time Ton substantially matches the given on-drive time set value Tons. In this case, a slight range is set above and below the on-drive time set value Tons to provide a matching condition. Generally, they do not match at first, so the determination is "NO" and the process proceeds to the next step S230.

In step S230, the control circuit 10 determines whether or not the calculated value of the on-drive time Ton is greater than the given on-drive time set value Tons. In this case, when the on-drive time Ton is greater than the on-drive time set value Tons, the drive performance is small and the time until the turning on is long. Thus, the determination is made as "YES", and the process proceeds to step S240 to execute a process for increasing the drive performance.

Since the initial value of the drive performance is set to be small so that the surge voltage of the IGBT 1 does not exceed the withstand voltage, the drive performance is increased in a normal process. Here, in the next step S250, the control circuit 10 sets the drive performance adjustment signal Sdx corresponding to the increased drive performance. As a result, in the on-drive control of the switching cycle described above, the drive performance adjustment signal Sdx set in step S110 is received as an updated value, and the constant current value of the constant current circuit 23 in the gate drive circuit 20 is increased.

By repeating the control as described above, the on-drive time Ton can be in a state in which the time Ton substantially matches the on-drive time set value Tons, and the control circuit 10 determines "YES" in step S220 to maintain the drive performance, and terminates the process. As a result, even if the gate drive time Ton shifts due to variations in the gate capacitance of the IGBT 1, it is possible to control that the gate drive time Ton matches the on drive time set value Tons by adjusting and setting the drive performance.

When the on-drive time Ton becomes equal to or less than the on-drive time set value Tons while repeating the control in this manner, the control circuit 10 determines "NO" in step S230, and proceeds to step S260. In this case, the control circuit 10 controls to decrease the drive performance. As a result, when the process proceeds to step S250, the control circuit 10 newly sets the updated drive performance adjustment signal Sdx, thereby controlling the on drive time Ton to match the on drive time set value Tons again.

Next, the above control operation will be described with reference to the timing chart of FIG. 4.

When the on-drive signal Son with the high level is output at time t0, and then, the on-drive time set value Tons elapses at time t1, and the gate voltage Vg reaches the reference voltage VrefU at time t2. Thus, the detection signal Vg changes to a high level. After that, when the gate voltage Vg reaches VG, the IGBT 1 is turned on.

The control circuit 10 calculates a period from time t0 to t2 as an on drive time Tona (here, a indicates the first time, hereinafter b, c, and so on) according to the on drive time Ton. Since this on-drive time Tona is longer than the on-drive time set value Tons, in order to shorten it, the control circuit 10 changes the drive performance adjustment signal Sdx adjusted to increase the drive performance from the initial value Sdx0 to Sdxa.

At this time, the amount of increase in the drive performance adjustment signal Sdx may be varied within a predetermined range, or may be set according to the difference between the on drive time Ton and the on drive time set value Tons.

As a result, in the next on state, when the on drive signal Son with the high level is output at time t4, and then, the on drive time set value Tons elapses at time t5, and the gate voltage Vg reaches the reference voltage VrefU, so that the gate detection signal Vg changes to the high level, and after that, when the gate voltage Vg reaches VG, the IGBT 1 is turned on.

The control circuit 10 calculates the period from time t4 to t5 as the on-drive time Ton as the on-drive time Tonb (at the second time). This on-drive time Tonb is substantially the same as the on-drive time set value Tons. In this state, the control circuit 10 maintains the drive performance.

In this embodiment, the gate voltage is detected by the gate voltage detection circuit 30 to monitor the on-drive time Ton with respect to the given on-drive time set value Tons, and the control circuit 10 sets and adjusts the drive performance so that the current value of the constant current supply to the gate of the IGBT 1 is controlled by the gate drive circuit 20.

As a result, it is possible to appropriately set the drive performance so as to minimize variations in the on drive time Ton due to variations in the gate capacitance of the IGBT 1 as the control target with respect to the on drive time set value Tons that is set preliminarily. Thus, it is possible to prevent the surge voltage from exceeding the withstand voltage, to maintain the gate voltage drive time appropriately and to prevent the switching loss from increasing.

In the above-described embodiment, the gate drive circuit 20 is configured to charge the gate of the IGBT 1 by supplying a constant current based on the drive performance. Thus, the configuration for setting and changing the increasing speed of the gate voltage Vg of the IGBT 1 is simple, and it is possible to provide a simple configuration for adjusting the on drive time.

In the above-described embodiment, the comparator 31 is provided as the gate voltage detection circuit 30. Alternatively, the present embodiment may not be limited to this feature, and may be provided as an A/D converter that converts the gate voltage Vg of the IGBT 1 into digital data. In this case, the same control can be performed by executing the process for obtaining the gate detection signal in the control circuit 10 using the gate detection signal as the digital data based on the gate voltage.

Second Embodiment

Figure 5:
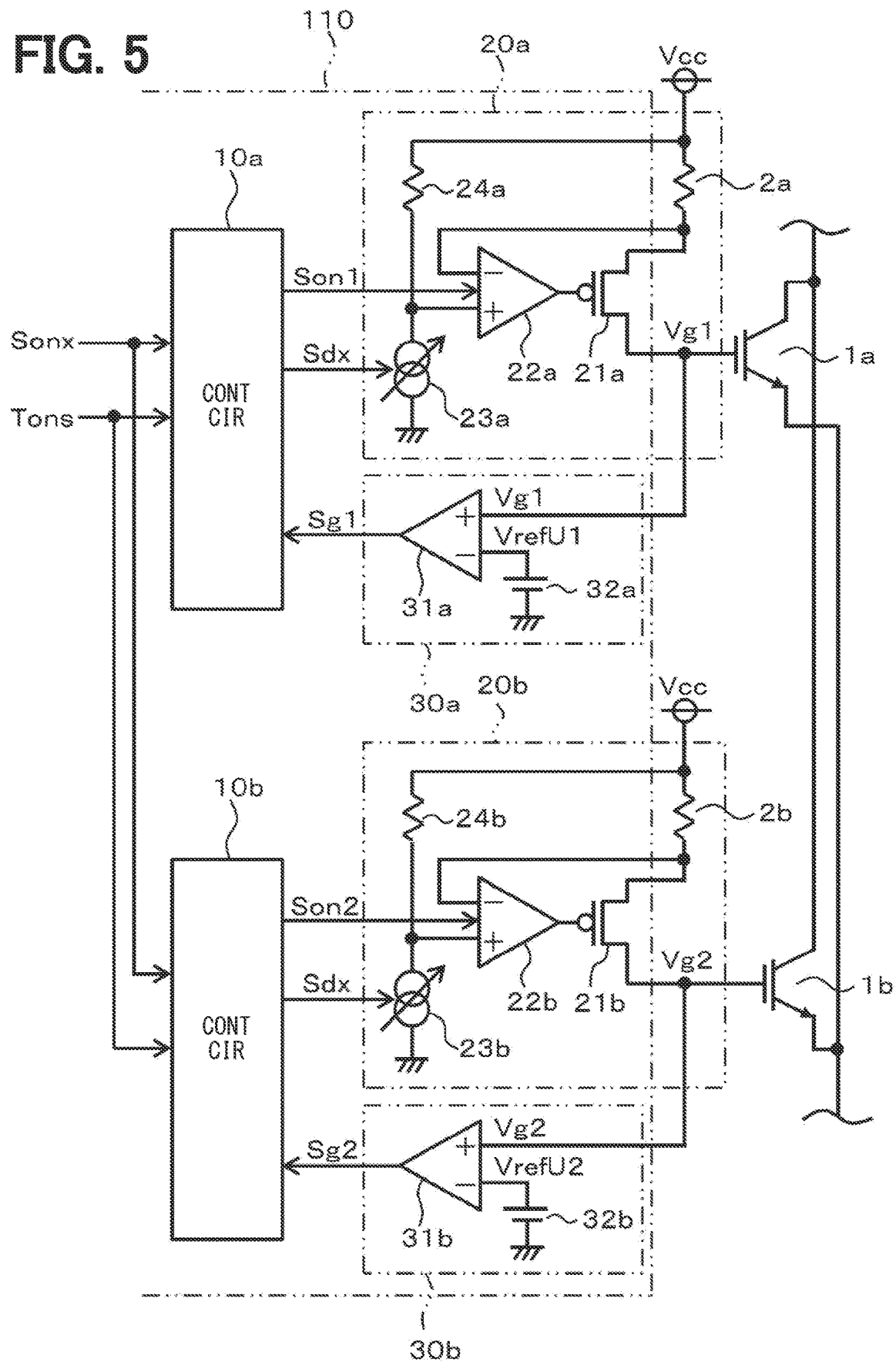
FIG. 5 is a diagram showing an electric configuration according to a second embodiment.
Figure 6:
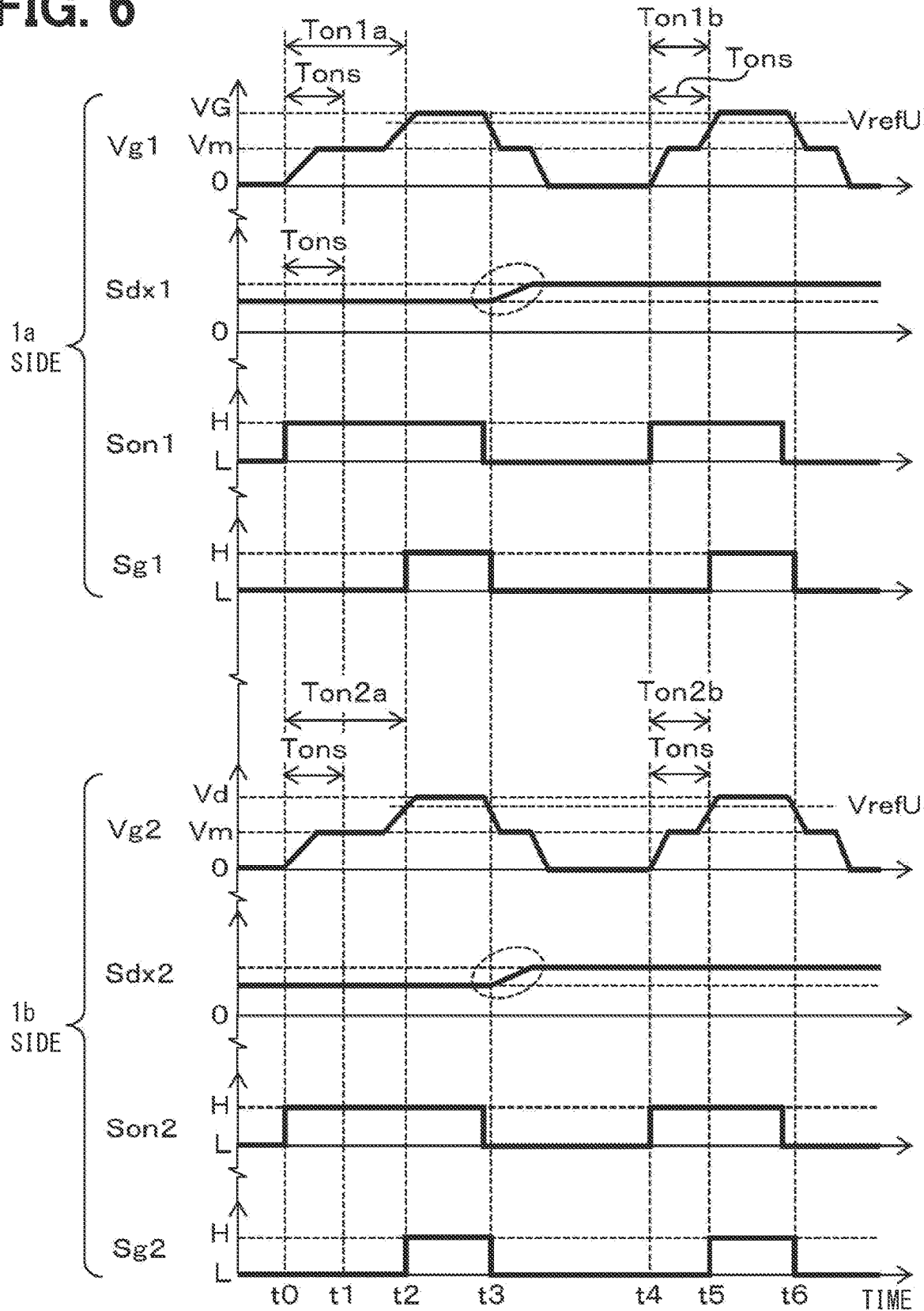
FIG. 6 is a timing chart according to the second embodiment.

FIGS. 5 to 6 show a device according to a second embodiment, and portions different from the first embodiment will be described below. In this embodiment, the gate drive device 110 is configured to drive two IGBTs 1a and 1b. Here, two IGBTs 1a and 1b are connected in parallel.

FIG. 5 shows an electrical configuration, and the gate drive device 110 includes two sets of the control circuit 10, the gate drive circuit 20, and the gate voltage detection circuit 30 in the gate drive device 100 shown in the first embodiment in respective IGBTs 1a and 1b. The configuration of each set is indicated by adding a suffix "a" to the configuration of the IGBT 1a and adding a suffix "b" to the configuration of the IGBT 1b.

The control circuits 10a and 10b are provided with the same on-drive signal Sonx and on-drive time set value Tons. The control circuit 10a provides the gate drive circuit 20a with the on drive signal Son1 and the drive performance adjustment signal Sdx1. The control circuit 10a also receives a gate detection signal Sg1 from the gate voltage detection circuit 30a. In addition, the control circuit 10b provides the gate drive circuit 20b with the on drive signal Son2 and the drive performance adjustment signal Sdx2. The control circuit 10b also receives a gate detection signal Sg2 from the gate voltage detection circuit 30b.

As a result, as shown in FIG. 6, the control circuits 10a and 10b perform the same control as in the first embodiment in accordance with the common on-drive time set value Tons, thereby adjusting the drive performance of the gate drive circuits 20a, 20b to an optimum state, so that it is possible to drive to match both the on-drive time Ton1 of the IGBT 1a and the on-drive time Ton2 of the IGBT 1b with the on-drive time set value Tons.

According to the second embodiment, it is possible to appropriately set the drive performance so as to minimize variations in the on drive time Ton1, Ton2 due to variations in the gate capacitance of the IGBTs 1a and 1b as the control target with respect to the on drive time set value Tons that is set preliminarily. Thus, it is possible to prevent the surge voltage from exceeding the withstand voltage, to maintain the gate voltage drive time appropriately and to prevent the switching loss from increasing.

Third Embodiment

Figure 7:
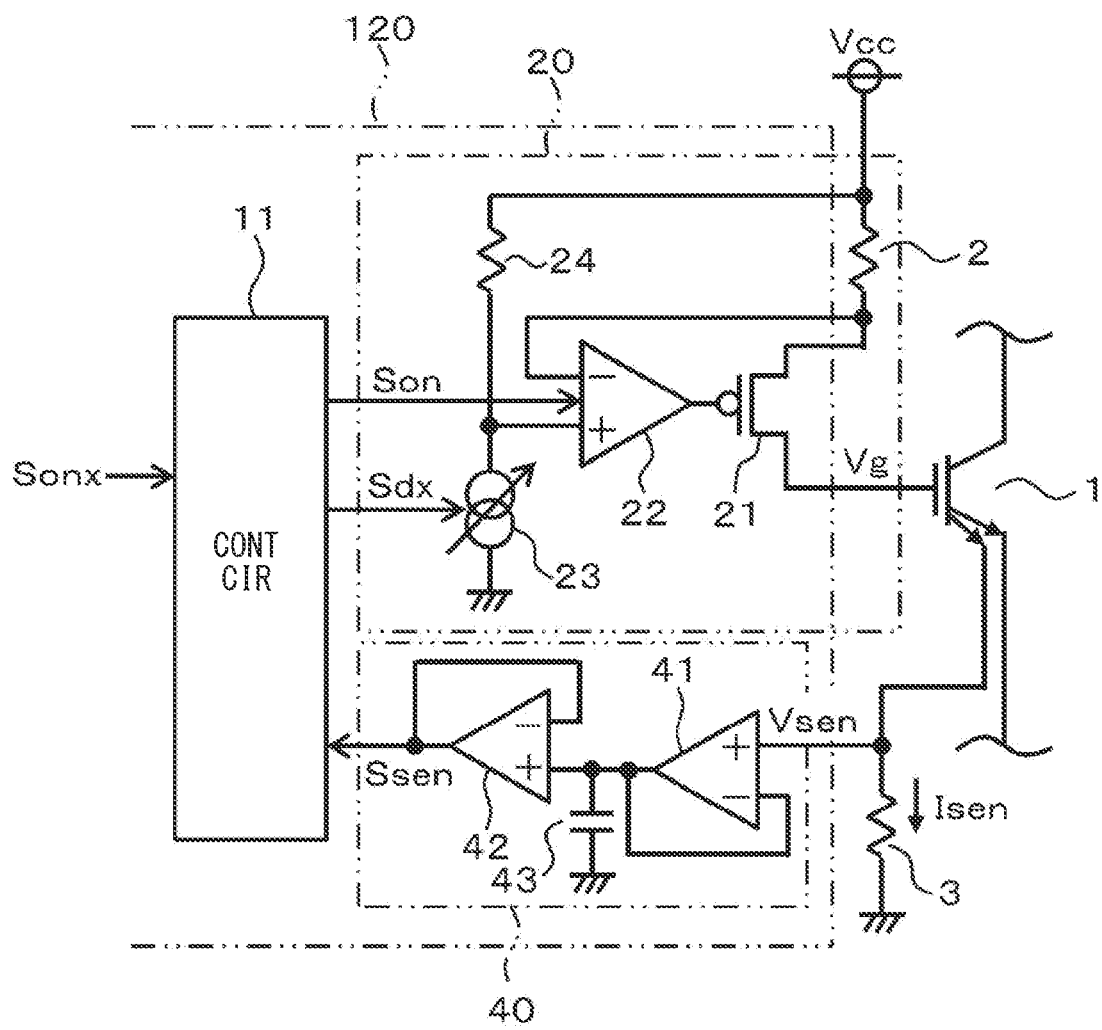
FIG. 7 is a diagram showing an electric configuration according to a third embodiment.
Figure 8:
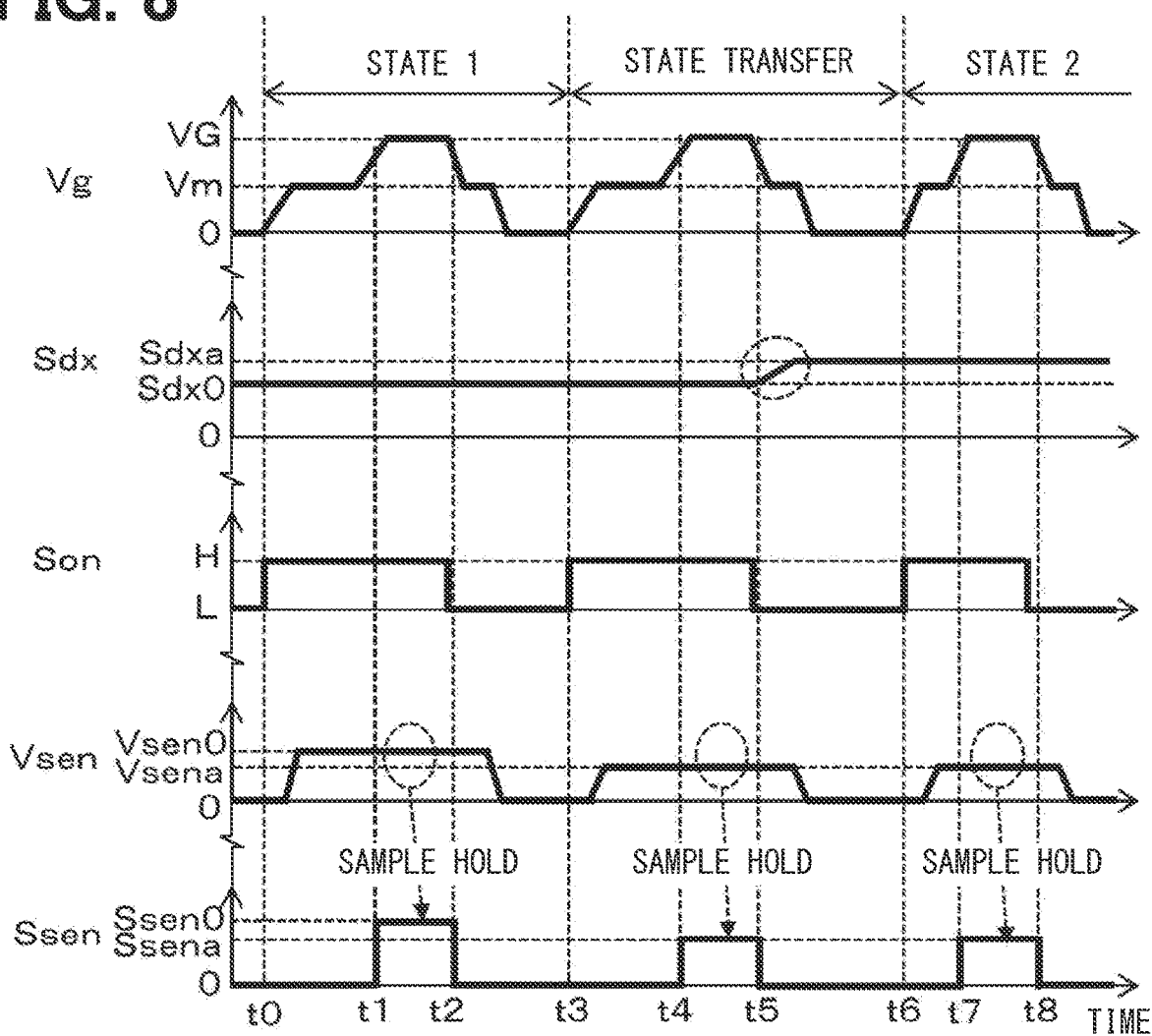
FIG. 8 is a timing chart according to the third embodiment.
Figure 9:
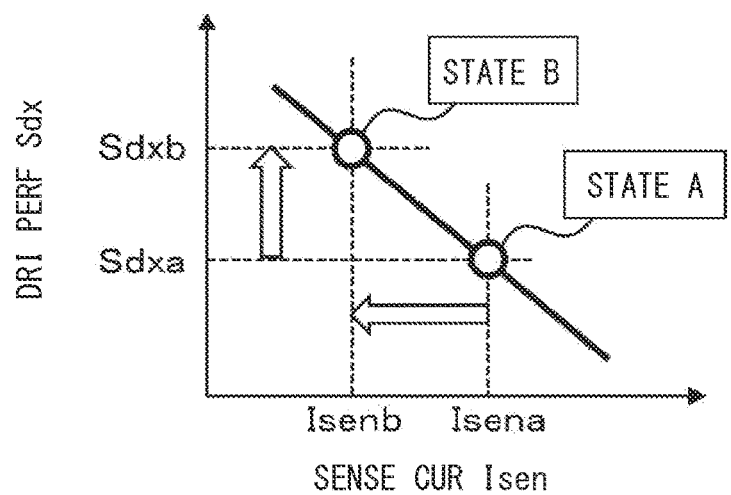
FIG. 9 is a diagram showing an operation explanation according to the third embodiment.

FIG. 7 to FIG. 9 show a third embodiment, and different portions from the first embodiment will be described below. In this embodiment, the gate drive device 120 is configured to have a sense current detection circuit 40 instead of the gate voltage detection circuit 30. Also, the IGBT 1 has a sense emitter terminal capable of detecting a sense current. A sense emitter terminal of the IGBT 1 is connected to the ground via a resistor 3 for current detection.

The sense current detection circuit 40 has operational amplifiers 41 and 42 and a capacitor 43. The sense current detection circuit 40 retrieves a terminal voltage Vsen generated across the resistor 3 by a sense current Isen flowing from the sense emitter terminal of the IGBT 1 to the resistor 3, and outputs an output through two operational amplifiers 41 and 42 as a buffer to the control circuit 11 as a sense current detection signal Ssen.

The control circuit 11 retrieves the sense voltage Vsen input from the sense current detection circuit 40 and the preset on-drive command signal Sonx, and outputs an on-drive signal Son based on the on-drive command signal Sonx to the gate drive circuit 20. In addition, the control circuit 11 outputs the drive performance during the on drive to the constant current circuit 23 of the gate drive circuit 20 as the drive performance adjustment signal Sdx.

In this embodiment, the control circuit 11 adjusts the drive performance of the IGBT 1 during the on-drive to be an appropriate level according to the sense current detection signal Ssen, and outputs the signal Ssen as the drive performance adjustment signal Sdx to the gate drive circuit 20 for setting and updating.

In this case, the control circuit 11 updates and sets the gate driving circuit 20 so as to reduce the drive performance when it is determined based on the sense current detection signal Ssen from the sense current detection circuit 40 that the sense current Isen of the IGBT 1 has increased, and when it is determined that the current of the IGBT 1 has decreased, the control circuit 11 updates and sets the gate driving circuit 20 so as to increase the drive performance.

As a result, when the sense current detection signal Ssen of the IGBT 1 is small, the current flowing through the IGBT 1 is small and the surge voltage is also small, so that the drive performance can be increased compared to the previous switching operation. Also, when the sense current detection signal Ssen of the IGBT 1 is large, the current flowing through the IGBT 1 is large and the surge voltage is large. Thus, the drive performance is reduced compared to the previous switching operation to restrict the surge voltage.

The contents of the above control will be described with reference to the timing chart of FIG. 8. In the drawing, it is assumed that the sample hold timing of the sense current detection signal Ssen is set after the gate voltage reaches a predetermined level and in a state where the IGBT 1 is sufficiently turned on. For this reason, although not shown in FIG. 7, the timing may be set by detecting the gate voltage of the IGBT 1, or the timing may be set after a certain period of time has passed since the high-level on drive signal Son was output.

When the on-drive command signal Sonx is input, the control circuit 11 sets the drive performance determined at the time of the previous switching operation as the drive performance adjustment signal Sdx0 in "state 1", and sets the on-drive timing as a high level on drive signal Son at time t0 to input it to the gate drive circuit 20. As a result, the gate drive circuit 20 charges the gate of the IGBT 1 by supplying a constant current to the gate of the IGBT 1 based on the input drive performance adjustment signal Sdx0. The gate voltage Vg of the IGBT 1 rises, and at time t1, the IGBT 1 transitions to the on state indicated by "state 1" in the drawing.

When the current flows while the IGBT 1 is in the on state, a sense current Isen proportional to this current flows from the sense emitter terminal through the resistor 3. As a result, a sense voltage Vsen corresponding to the product of the resistance value of the resistor 3 and the sense current Isen is generated at the terminal of the resistor 3. This sense voltage Vsen is detected by the sense current detection circuit 40 at time t2, and a sense current detection signal Ssen0 is transmitted to the control circuit 11.

After that, when the current of the IGBT 1 decreases and the sense current signal decreases from Ssen0 to Ssena in the switching cycle "at the time of state transition", the control circuit 11 determines the drive performance according to the decreased sense current signal Ssena. In this case, since the sense current signal Ssena is decreased, in the next switching cycle from time t4 to t8, which is "at the time of state transition", the drive performance is transmitted as the drive performance adjustment signal which is increased from Sdx0 to Sdxa to the gate drive circuit 20 at time t7 when the turning-off start time. The relationship between the level of the sense current signal Ssen and the drive performance Sdx at this time is as shown in FIG. 9.

For example, when the sense current Isena is small, the current of the IGBT 1 is small and the surge voltage is small. Thus, the drive performance of the previous switching operation is increased from Sdxa to Sdxb. Conversely, when the sense current Isenb is large, the current of the IGBT 1 is large and the surge voltage is large. Thus, the drive performance of the previous switching operation is decreased from Sdxb to Sdxa.

In this embodiment, the control circuit 11 increases the drive performance adjustment signal to be output to the gate drive circuit 20 at time t7 to Sdxa, which is substantially equivalent to setting the on drive time set value Ton short, so that the on-drive time Ton is also adjusted to a short time.

According to the third embodiment as described above, the sense current detection circuit 40 is provided, and the drive performance is adjusted according to the level of the sense current detection signal Ssen by the control circuit 11 according to the relationship shown in FIG. 9. Thus, the switching loss can be reduced while controlling the surge voltage of the IGBT 1.

In the above embodiment, the sense current detection circuit 40 is configured by a combination of operational amplifiers, alternatively, the A/D converter may convert the sense voltage Vsen into a sense current detection signal Ssen of digital data and output it to the control circuit 11. Thus, the level may be determined in the control circuit 11.

Fourth Embodiment

Figure 10:
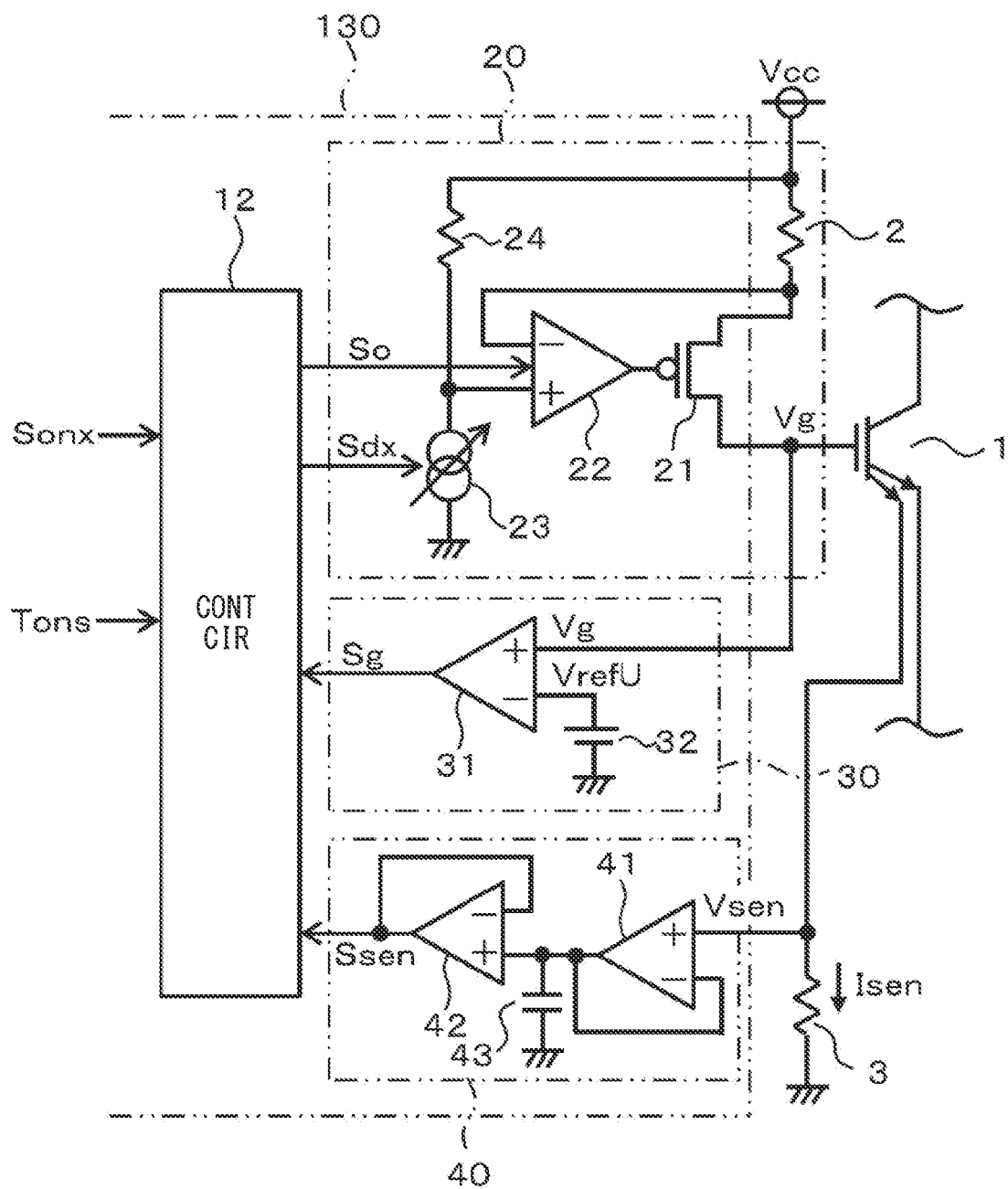
FIG. 10 is a diagram showing an electric configuration according to a fourth embodiment.
Figure 11:
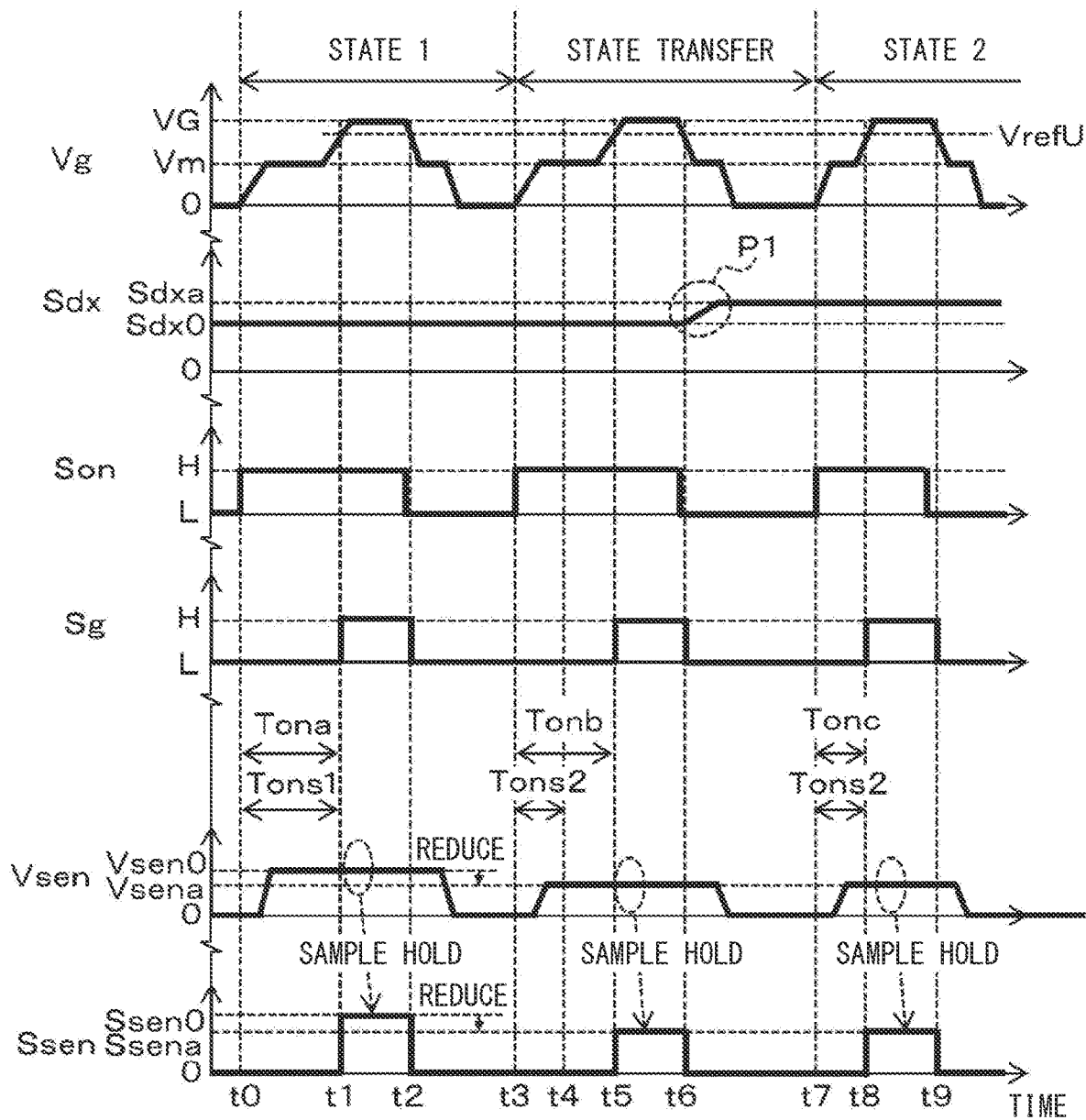
FIG. 11 is a timing chart according to the fourth embodiment.
Figure 12:
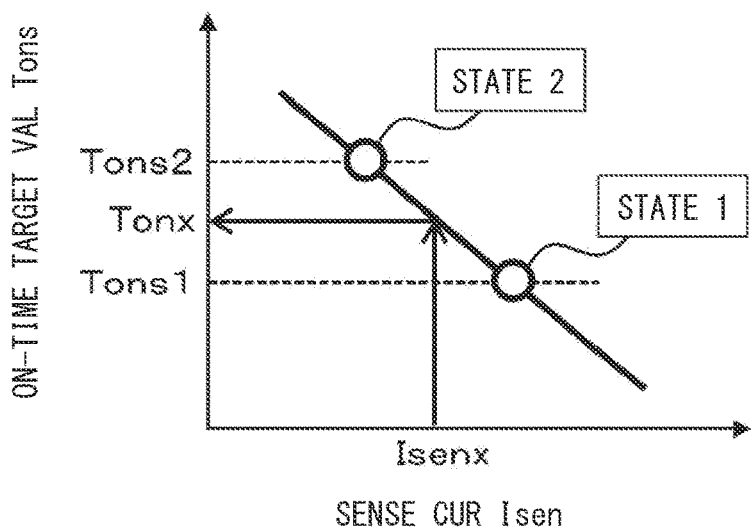
FIG. 12 is a diagram showing an operation explanation according to the fourth embodiment.

FIG. 10 to FIG. 12 show a fourth embodiment, and different portions from the first embodiment will be described below. In this embodiment, the gate drive device 130 has a configuration in which the sense current detection circuit 40 of the third embodiment is added to the configuration of the gate drive device 100 of the first embodiment.

In this configuration, the control circuit 12 instead of the control circuit 10 includes input signals of a preset on-drive command signal Sonx, an on-drive time set value Tons, a gate detection signal Sg from the gate voltage detection circuit 30, and the sense current detection signal Ssen from the sense current detection circuit 40.

The control circuit 12 sets the on-drive timing from the on-drive command signal Sonx, outputs the on-drive signal Son to the gate drive circuit 20, and outputs the drive performance at the time of on-drive as the drive performance adjustment signal Sdx.

Further, the control circuit 12 outputs the drive performance during on-drive as the drive performance adjustment signal Sdx according to the comparison result and the sense current detection signal Ssen by comparing the on drive time Ton from the output timing of the high-level on-drive signal Son to the input of the gate detection signal Sg with the preset on-drive time set value Tons.

As a result, the control circuit 12 changes and sets the drive performance while detecting the change in the current of the IGBT 1 based on the change in the level of the sense current detection signal Ssen, and further, sets and change the drive performance so that the on drive time Ton reaches the set on drive set value Tons. As a result, the IGBT 1 can be turned on with the optimum on-drive time Tons while protecting against the surge voltage.

A specific control operation will be described with reference to FIG. 11.

When the on-drive command signal Sonx is input, the control circuit 12 sets the drive performance determined at the time of the previous switching operation as the drive performance adjustment signal Sdx, and sets the on-drive timing as a high level on drive signal Son at time t0 to input it to the gate drive circuit 20.

The gate drive circuit 20 charges the gate of the IGBT 1 with a constant current based on the input drive performance, thereby increasing the gate voltage Vg and turning on the IGBT 1. At this time, when the gate voltage Vg of the IGBT 1 exceeds the reference voltage VrefU for detecting the on state, the gate voltage detection circuit 30 detects it and outputs a high-level gate detection signal Sg to the control circuit 12.

Also, while the IGBT 1 is in an on state, a current flows through the IGBT 1, and a mirror current flows from the sense emitter terminal to the resistor 3 to generate a sense voltage Vsen which is the product of these currents. A sense current detection circuit 40 detects the sense voltage Vsen and outputs a sense current detection signal Ssen to the control circuit 12.

The control circuit 12 sets the drive performance by comparing the on-drive time Ton from the on-drive timing to the detection of the gate voltage with a preset on-drive time set value Tons. In this case, when the on-drive time Ton is longer than the on-drive time set value Tons, the drive performance adjustment signal Sdx is set so as to increase the drive performance over the previous switching operation. When the on-drive time Ton is shorter than the on-drive time set value Tons, the drive performance is lowered from the previous switching operation.

Further, the control circuit 12 determines the drive performance according to the sense current detection signal Ssen, and transmits the drive performance to the gate drive circuit 20 as the drive power adjustment signal Sdx. In this case, changing and setting the drive performance is substantially equivalent to changing and setting the on drive time set value Tons.

For example, when the sense current Isena is small, the current of the IGBT 1 is small and the surge voltage is small. Thus, the drive performance of the previous switching operation is increased from Sdxa to Sdxb. As shown in FIG. 12, this means that the on-drive time set value Tons is changed and set from Tons1 to a longer on-drive time set value Tons2.

Conversely, when the sense current Isenb is large, the current of the IGBT 1 is large and the surge voltage is large. Thus, the drive performance of the previous switching operation is decreased from Sdxb to Sdxa. As shown in FIG. 12, this means that the on-drive time set value Tons is changed and set from Tons2 to a shorter on-drive time set value Tons1.

According to the fourth embodiment, the drive performance is determined by the control circuit 12 based on the on drive time Ton and the sense current detection signal Son obtained by mirroring the current of the IGBT 1. Therefore, the on drive time Ton is set to the predetermined on drive time set value Tons and the drive performance can be changed according to the current of the IGBT 1, so that the switching loss can be reduced while controlling the surge voltage of the IGBT 1.

Fifth Embodiment

Figure 13:
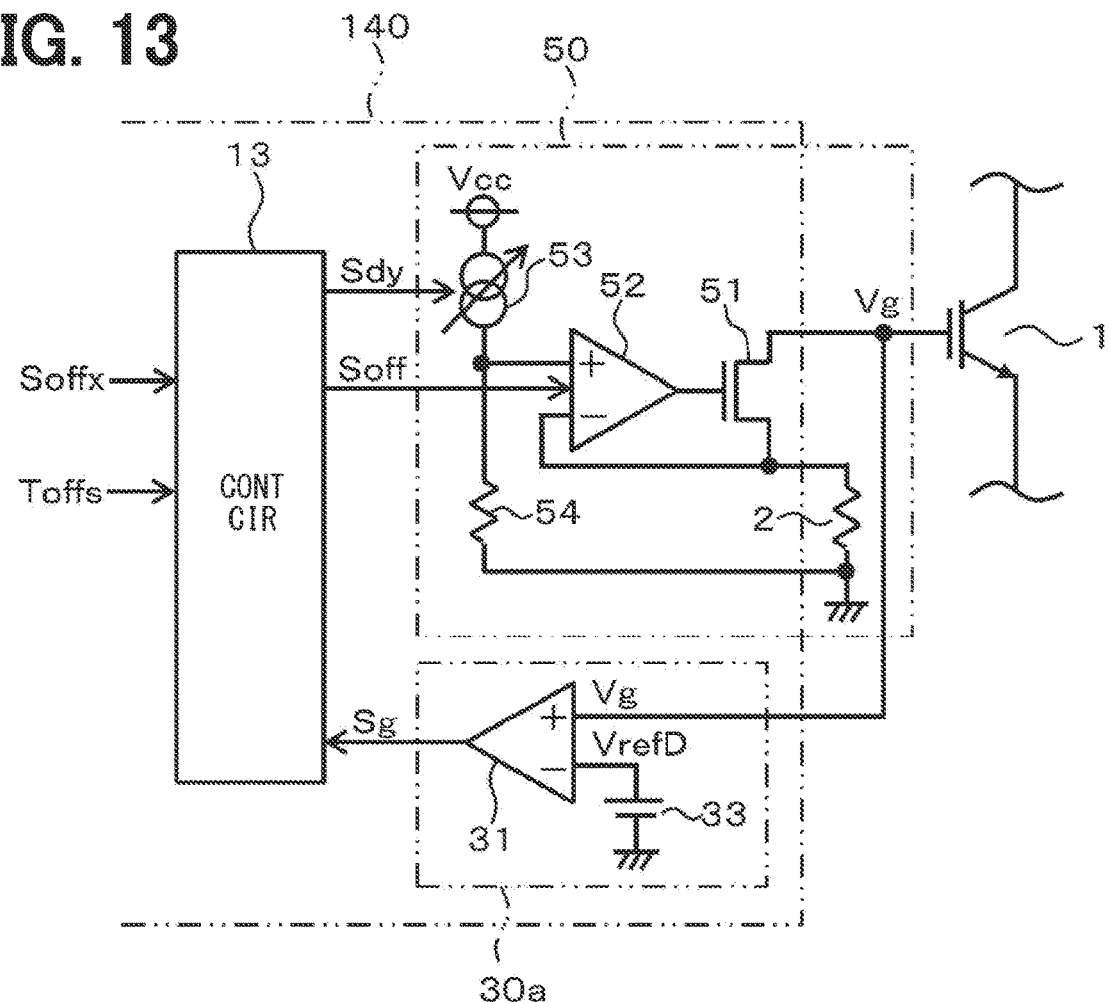
FIG. 13 is a diagram showing an electric configuration according to a fifth embodiment.

FIG. 13 shows a fifth embodiment. Differences from the first embodiment will be described below. In this embodiment, the gate drive device 140 is configured to include the control circuit 13, the gate drive circuit 50 for off-drive, and the gate voltage detection circuit 30*a*.

The control circuit 13 receives an off-driving command signal Soffx from an external circuit for controlling on/off control of the IGBT 1 and is input an off-drive time set value Toffs. The control circuit 13 outputs an off-drive signal Soff to the gate drive circuit 50 in accordance with the supplied off-drive command signal Soffx, and outputs a drive performance voltage signal Sdy in accordance with the off-drive time set value Toffs. Further, the control circuit 13 receives the gate detection signal Sg that has been switched to the off state, from the gate voltage detection circuit 30*a*.

The gate drive circuit 50 includes a N-channel MOS transistor 51 for gate drive, an error amplifier 52 and a constant current circuit 53. The MOS transistor 51 has a source connected to the ground via the resistor 2 and a drain connected to the gate of the IGBT 1. A gate of the MOS transistor 51 is connected to an output terminal of the error amplifier 52.

The error amplifier 52 has an inverting input terminal connected to the source of the MOS transistor 51 and a non-inverting input terminal connected to the ground via the resistor 54 and connected to the DC power supply Vcc through the constant current circuit 53. The constant current circuit 53 is configured such that the constant current value is changed and set by the drive performance voltage signal Sdy, and is configured to adjust the voltage applied to the non-inverting input terminal of the error amplifier 52 by flowing a constant current to the resistor 54.

The error amplifier 52 outputs the voltage to the gate of the MOS transistor 51 to match the voltage generated in the resistor 54 with flowing the constant current of the constant current circuit 53 according to the voltage of the DC power supply Vcc, with the voltage generated with flowing the current in the resistor 2 according to the voltage of the DC power supply Vcc. Thereby, the current flowing through the MOS transistor 51 is controlled to be a constant current. The constant current value that flows from the gate of the IGBT 1 to the ground by the MOS transistor 51 can be changed by adjusting the drive performance voltage signal Sdy.

The gate voltage detection circuit 30*a* has a comparator 31 and a reference power supply 33. The comparator 31 has a non-inverting input terminal connected to the gate of the IGBT 1 and an inverting input terminal connected to the reference power supply 32. The reference voltage VrefD of the reference power supply 33 is set to a voltage slightly higher than the gate voltage when the IGBT 1 is turned off, and the comparator 31 outputs the gate detection signal Sg with the high level to the control circuit 13 showing that it is switched to the off state when the gate voltage Vg of the IGBT 1 drops to the reference voltage VrefD.

By adopting the above configuration, although there is a difference in the on/off operations, by performing the off drive control of the IGBT 1 in substantially the same manner as in the first embodiment, the off drive time Toff is set to match the off drive time set value Toffs.

In this embodiment, the gate voltage vg is detected by the gate voltage detection circuit 30*a* to monitor the off drive time Ton with respect to the given off drive time set value Toffs, and the control circuit 13 sets and adjusts the drive performance so that the current value of the constant current supply to the gate of the IGBT 1 is controlled by the gate drive circuit 50.

As a result, it is possible to appropriately set the drive performance so as to minimize variations in the off drive time Toff due to variations in the gate capacitance of the IGBT 1 as the control target with respect to the off drive time set value Toffs that is set preliminarily. Thus, it is possible to prevent the surge voltage from exceeding the withstand voltage, to maintain the gate voltage drive time appropriately and to prevent the switching loss from increasing.

In the above-described embodiment, the gate drive circuit 50 is configured to discharge the gate of the IGBT 1 by flowing a constant current based on the drive performance. Thus, the configuration for setting and changing the decreasing speed of the gate voltage Vg of the IGBT 1 is simple, and it is possible to provide a simple configuration for adjusting the off drive time.

In the above-described embodiment, the comparator 31 is provided as the gate voltage detection circuit 30*a*. Alternatively, the present embodiment may not be limited to this feature, and may be provided as an A/D converter that converts the gate voltage Vg of the IGBT 1 into digital data. In this case, the same control can be performed by executing the process for obtaining the gate detection signal in the control circuit 13 using the gate detection signal as the digital data based on the gate voltage.

Further, in the above-described embodiment, the configuration for performing the off-drive control has been shown, alternatively, this configuration can also be applied as a configuration in which this configuration is combined with each of the first to fourth embodiments. This allows both on and off drive control to be implemented.

Sixth Embodiment

Figure 14:
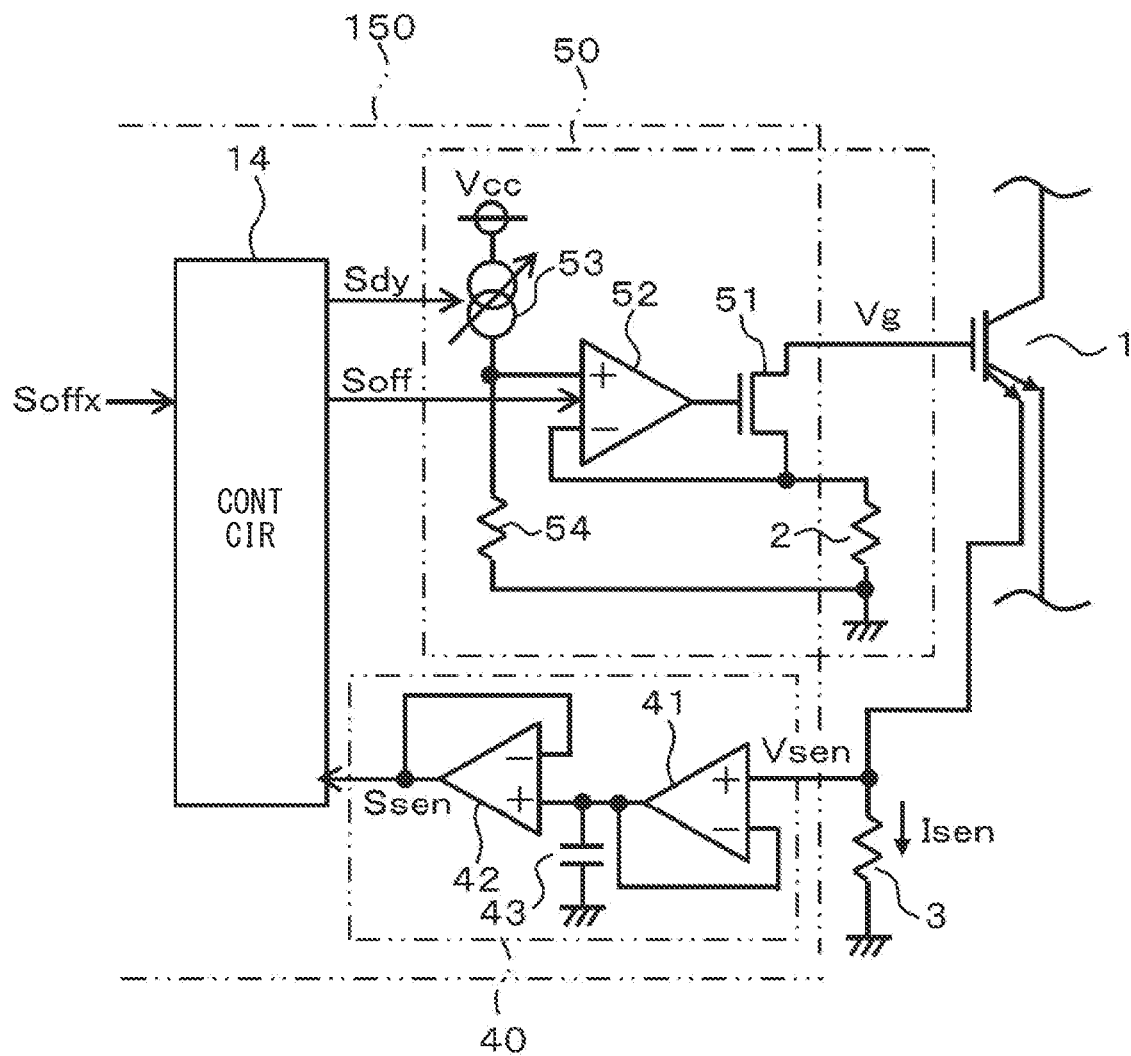
FIG. 14 is a diagram showing an electric configuration according to a sixth embodiment.

FIG. 14 shows a sixth embodiment. Differences from the first embodiment will be described below. In this embodiment, the gate drive device 150 is configured to include the control circuit 14, the gate drive circuit 50 for off-drive, and the sense current detection circuit 40. Also, the IGBT 1 has a sense emitter terminal capable of detecting a sense current. A sense emitter terminal of the IGBT 1 is connected to the ground via a resistor 3 for current detection.

The control circuit 14 retrieves the sense voltage Vsen input from the sense current detection circuit 40 and the preset off-drive command signal Soffx, and outputs an off-drive signal Soff based on the off-drive command signal Soffx to the gate drive circuit 50. In addition, the control circuit 14 outputs the drive performance during the off drive to the constant current circuit 53 of the gate drive circuit 50 as the drive performance adjustment signal Sdy.

In this embodiment, the control circuit 14 adjusts the drive performance of the IGBT 1 during the off-drive to be an appropriate level according to the sense current detection signal Ssen, and outputs the signal Ssen as the drive performance adjustment signal Sdy to the gate drive circuit 50 for setting and updating.

In this case, the control circuit 14 updates and sets the gate driving circuit 50 so as to reduce the drive performance when it is determined based on the sense current detection signal Ssen from the sense current detection circuit 40 that the sense current Isen of the IGBT 1 has increased, and when it is determined that the current of the IGBT 1 has decreased, the control circuit 11 updates and sets the gate driving circuit 20 so as to increase the drive performance.

As a result, when the sense current detection signal Ssen of the IGBT 1 is small, the current flowing through the IGBT 1 is small and the surge voltage is also small, so that the drive performance can be increased compared to the previous switching operation. Also, when the sense current detection signal Ssen of the IGBT 1 is large, the current flowing through the IGBT 1 is large and the surge voltage is large. Thus, the drive performance is reduced compared to the previous switching operation to restrict the surge voltage.

According to the sixth embodiment as described above, the sense current detection circuit 40 is provided, and the drive performance is adjusted according to the level of the sense current detection signal Ssen by the control circuit 14. Thus, the switching loss can be reduced while controlling the surge voltage of the IGBT 1.

In the above embodiment, the sense current detection circuit 40 is configured by a combination of operational amplifiers, alternatively, the A/D converter may convert the sense voltage Vsen into a sense current detection signal Ssen of digital data and output it to the control circuit 14. Thus, the level may be determined in the control circuit 14.

Further, in the above-described embodiment, the configuration for performing the off-drive control has been shown, alternatively, this configuration can also be applied as a configuration in which this configuration is combined with each of the first to fourth embodiments. This allows both on and off drive control to be implemented.

Seventh Embodiment

Figure 15:
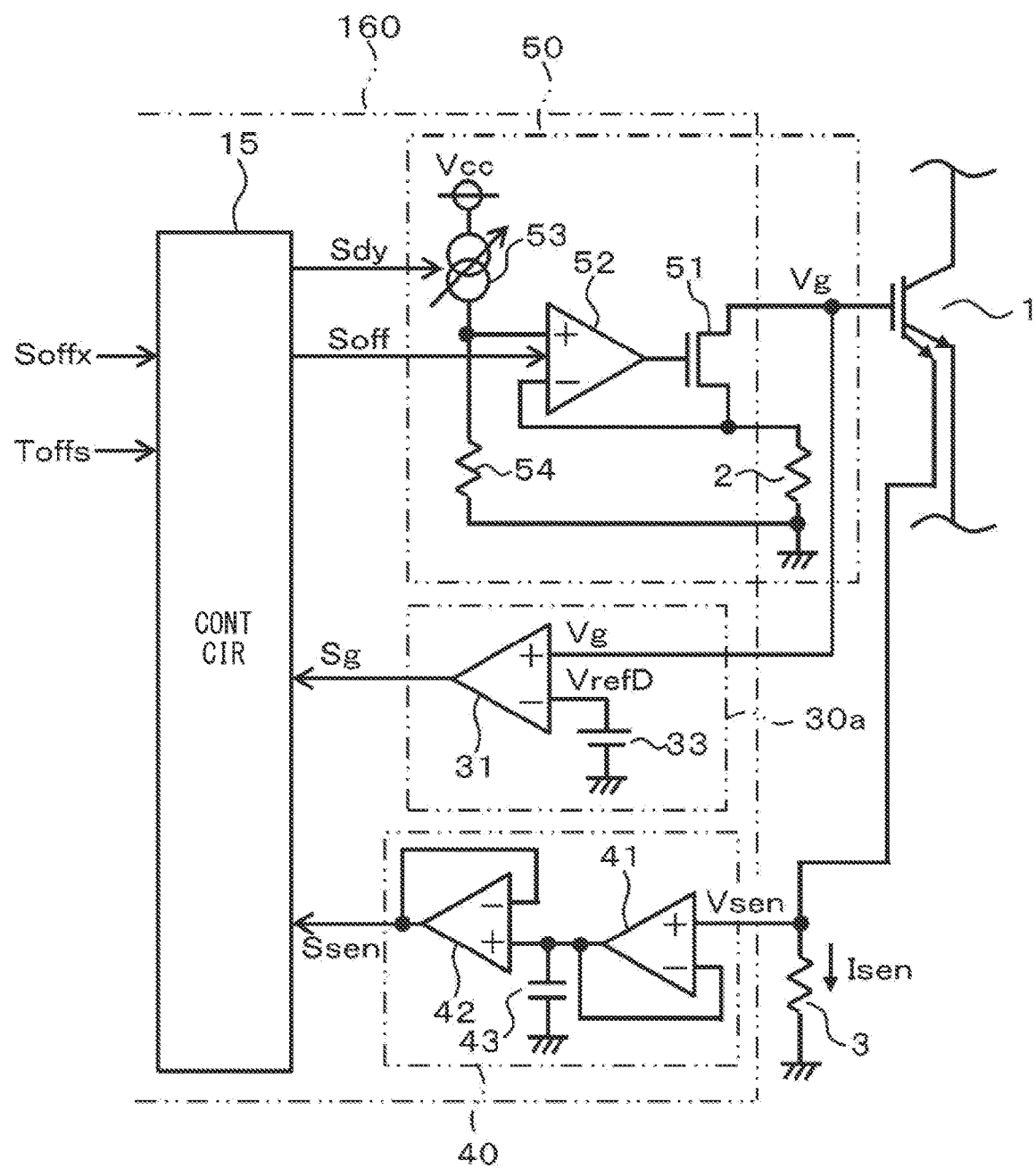
FIG. 15 is a diagram showing an electric configuration according to a seventh embodiment.

FIG. 15 shows a seventh embodiment. Differences from the first embodiment will be described below. In this embodiment, the gate drive device 160 has a configuration in which the sense current detection circuit 40 of the sixth embodiment is added to the configuration of the gate drive device 140 of the fifth embodiment.

In this configuration, the control circuit 15 instead of the control circuit 13 includes input signals of a preset off-drive command signal Soffx, an off-drive time set value Toffs, a gate detection signal Sg from the gate voltage detection circuit 30a, and the sense current detection signal Ssen from the sense current detection circuit 40.

The control circuit 15 sets the off-drive timing from the off-drive command signal Soffx, outputs the off-drive signal Soff to the gate drive circuit 50, and outputs the drive performance at the time of off-drive according to the drive performance adjustment signal Sdy.

Further, the control circuit 15 outputs the drive performance during off-drive as the drive performance adjustment signal Sdy according to the comparison result and the sense current detection signal Ssen by comparing the off drive time Toff from the output timing of the high-level off-drive signal Soff to the input of the gate detection signal Sg with the preset off-drive time set value Toffs.

As a result, the control circuit 15 changes and sets the drive performance while detecting the change in the current of the IGBT 1 based on the change in the level of the sense current detection signal Ssen, and further, sets and change the drive performance so that the off drive time Toff reaches the set off drive set value Toffs. As a result, the IGBT 1 can be off-driven at the optimum off-drive time set value Toffs while protecting against the surge voltage.

According to the seventh embodiment, the drive performance is determined by the control circuit 15 based on the off drive time Toff and the sense current detection signal Ssen obtained by mirroring the current of the IGBT 1. Therefore, the off drive time Toff is set to the predetermined off drive time set value Toffs and the drive performance can be changed according to the current of the IGBT 1, so that the switching loss can be reduced while controlling the surge voltage of the IGBT 1.

Further, in the above-described embodiment, the configuration for performing the off-drive control has been shown, alternatively, this configuration can also be applied as a configuration in which this configuration is combined with each of the first to fourth embodiments. This allows both on and off drive control to be implemented.

Eighth Embodiment

Figure 16:
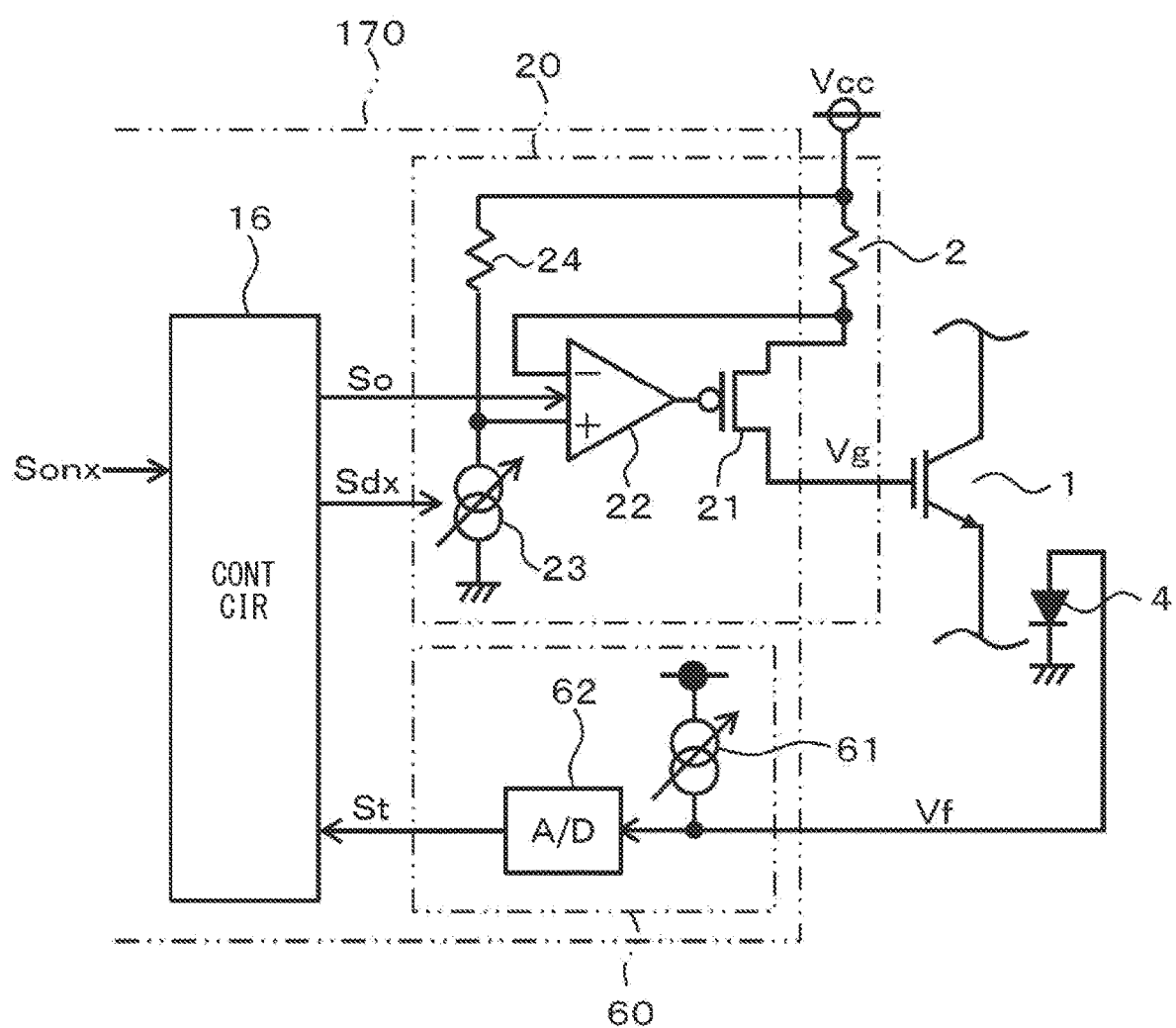
FIG. 16 is a diagram showing an electric configuration according to an eighth embodiment.

FIG. 16 shows an eighth embodiment. Differences from the first embodiment will be described below. In this embodiment, the gate drive device 170 is configured to have a temperature detection circuit 60 instead of the gate voltage detection circuit 30. Also, the IGBT 1 is provided with a diode 4 in the vicinity thereof for detecting the temperature by means of the forward voltage Vf.

The temperature detection circuit 60 has a constant current circuit 61 and an A/D converter 62. The temperature detection circuit 60 causes a constant current circuit 61 to pass a predetermined current through the diode 4 arranged near the IGBT 1, retrieves the forward voltage Vf at this time into the A/D converter 62, and converts it into a digital signal as a temperature detection signal St to output the signal St to the control circuit 16.

The control circuit 16 receives a preset on-drive command signal Sonx and a temperature detection signal St input from the temperature detection circuit 60, and outputs an on-drive signal Son according to the on-drive command signal Sonx to the gate drive circuit 20. In addition, the control circuit 16 outputs the drive performance of the IGBT 1 during the on drive to the constant current circuit 23 of the gate drive circuit 20 as the drive performance adjustment signal Sdx.

In this embodiment, the control circuit 16 adjusts the drive performance of the IGBT 1 during the on-drive to be an appropriate level according to the temperature detection signal St, and outputs the signal Ssen as the drive performance adjustment signal Sdx to the gate drive circuit 20 for setting and updating.

In this case, the control circuit 16 updates and sets the gate drive circuit 20 so as to reduce the drive performance when it is determined that the temperature of the IGBT 1 has decreased based on the temperature detection signal St from the temperature detection circuit 60, and to increase the drive performance when it is determined that the temperature of the IGBT 1 has increased.

As a result, when the temperature of the IGBT 1 is low, the surge voltage of the IGBT 1 increases, and can be suppressed by lowering the drive performance compared to the previous switching operation. In addition, when the temperature of the IGBT 1 is high, the surge voltage of the IGBT 1 becomes small, so that the drive performance can be increased compared to the previous switching operation.

According to the eighth embodiment, the temperature detection circuit 60 for detecting the temperature of the IGBT 1 from the forward voltage Vf of the diode 4 is provided, and the control circuit 16 adjusts the drive performance according to the detected temperature of the IGBT 1. Therefore, it is possible to reduce the switching loss while controlling the surge voltage of the IGBT 1.

Ninth Embodiment

Figure 17:
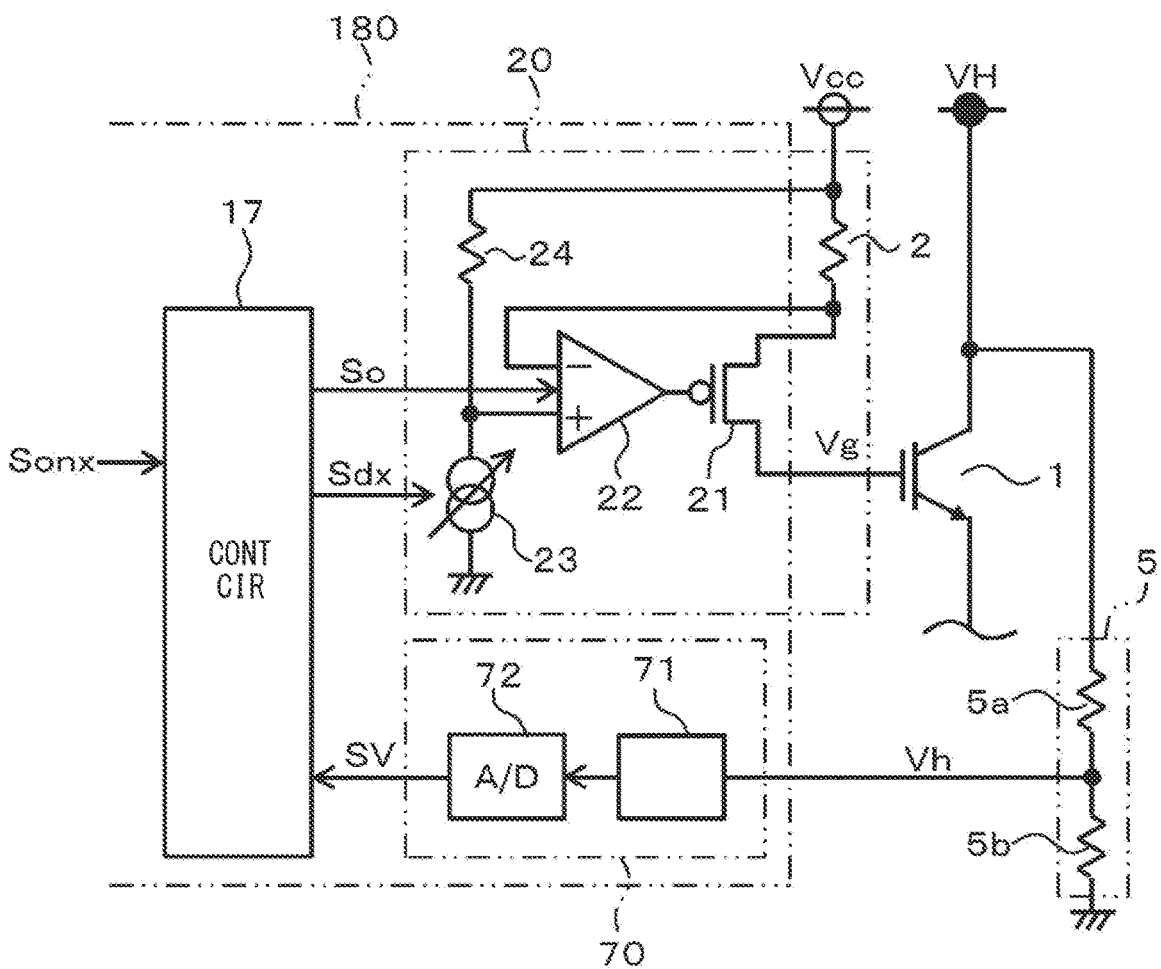
FIG. 17 is a diagram showing an electric configuration according to a ninth embodiment.

FIG. 17 shows a ninth embodiment. Differences from the first embodiment will be described below. In this embodiment, the gate drive device 180 is configured to have a power supply voltage detection circuit 70 instead of the gate voltage detection circuit 30. Also, a voltage dividing circuit 5 for detecting the DC voltage VH of the high voltage power supply connected to the IGBT 1 is arranged. The voltage dividing circuit 5 includes a series circuit of resistors 5a and 5b that divides the DC voltage VH of the high voltage power supply.

The power supply voltage detection circuit 70 has an input circuit 71 and an A/D converter 72. The input circuit 71 retrieves the terminal voltage Vh of the resistor 5b obtained by dividing the DC voltage VH of the high-voltage power supply by the voltage dividing circuit 5, and inputs it to the A/D converter 72 as an analog voltage signal. The A/D converter 72 converts the voltage signal output from the input circuit 71 into a digital signal corresponding to the voltage of the high-voltage power supply, and inputs it to the control circuit 17 as the power supply voltage detection signal SV.

The control circuit 17 receives a preset on-drive command signal Sonx and a power supply voltage detection signal SV input from the power supply voltage detection circuit 70, and outputs an on-drive signal Son according to the on-drive command signal Sonx to the gate drive circuit 20. In addition, the control circuit 17 outputs the drive performance during the on drive to the constant current circuit 23 of the gate drive circuit 20 as the drive performance adjustment signal Sdx.

In this embodiment, the control circuit 17 adjusts the drive performance of the IGBT 1 during the on-drive to be an appropriate level according to the power supply voltage detection signal SV, and outputs the signal Ssen as the drive performance adjustment signal Sdx to the gate drive circuit 20 for setting and updating.

In this case, the control circuit 17 updates and sets the gate drive circuit 20 so as to reduce the drive performance when it determines that the power supply voltage HV applied to the IGBT 1 has increased based on the power supply voltage detection signal SV from the power supply voltage detection circuit 70. When it is determined that the power supply voltage HV has decreased, the setting is updated so as to increase the drive performance.

As a result, when the DC voltage VH of the high-voltage power supply applied to the IGBT 1 is high, the surge voltage of the IGBT 1 increases, and can be suppressed by lowering the drive performance compared to the previous switching operation. Also, when the DC voltage VH is low, the surge voltage of the IGBT 1 is small, so that the drive performance can be increased compared to the previous switching operation.

According to the ninth embodiment as described above, the DC voltage VH applied to the IGBT 1 is divided by the voltage dividing circuit 5, and the power supply voltage detection circuit 70 is arranged to detect the divided voltage Vh corresponding to the power supply voltage as the power supply voltage signal SV of the digital signal. Further, the control circuit 17 is provided to adjust the drive performance according to the magnitude of the DC voltage VH. Thus, the switching loss can be reduced while controlling the surge voltage of the IGBT 1.

Tenth Embodiment

Figure 18:
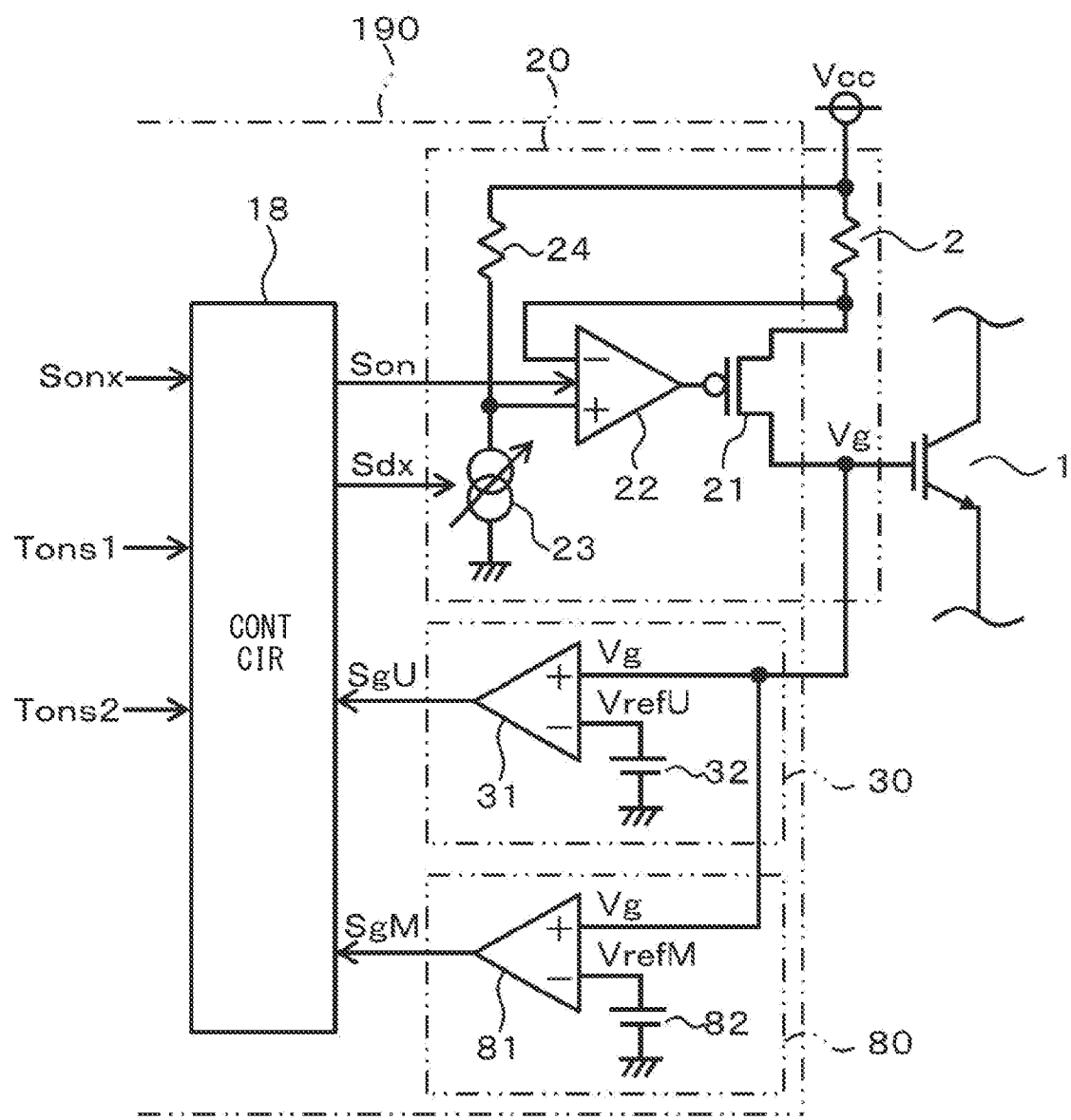
FIG. 18 is a diagram showing an electric configuration according to a tenth embodiment.
Figure 19:
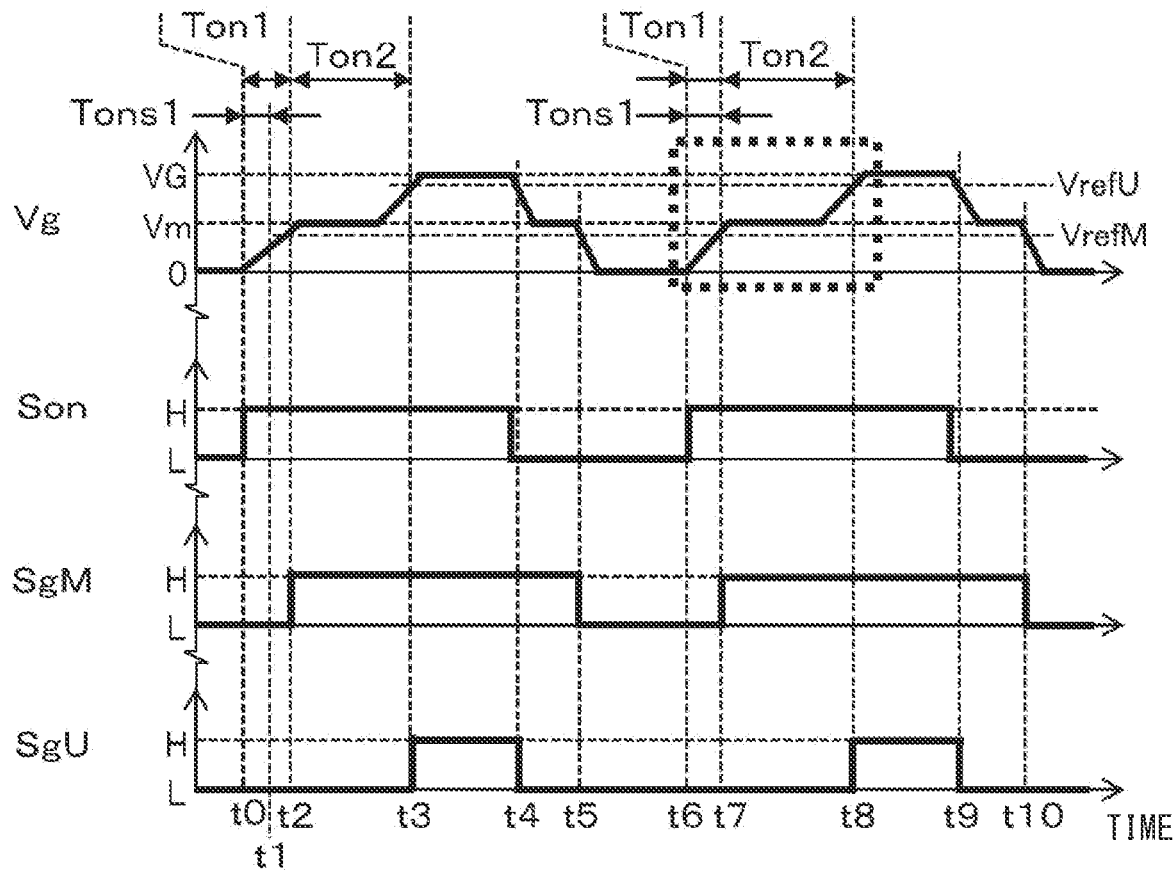
FIG. 19 is a timing chart of a first half according to the tenth embodiment.
Figure 20:
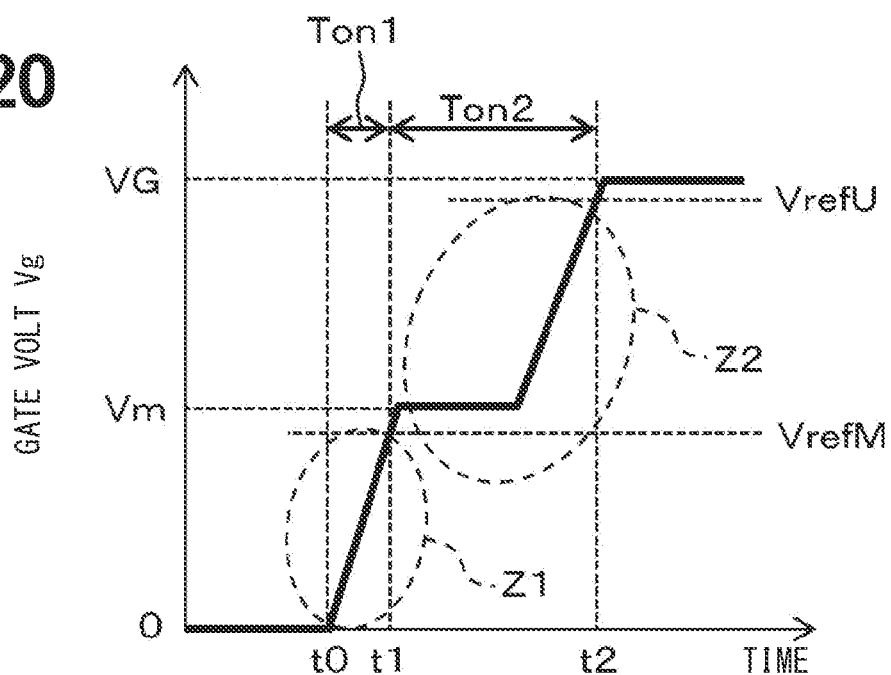
FIG. 20 is a timing chart of a second half according to the tenth embodiment.

FIG. 18 to FIG. 20 show a tenth embodiment, and different portions from the first embodiment will be described below. In this embodiment, the gate drive device 190 has a configuration in which another gate voltage detection circuit 80 is added in addition to the gate voltage detection circuit 30 in the configuration of the gate drive device 100 of the first embodiment.

The gate voltage detection circuit 80 has a comparator 81 and a reference power supply 82. The comparator 81 has a non-inverting input terminal connected to the gate of the IGBT 1 and an inverting input terminal connected to the reference power supply 82. The reference power supply 82 is set to a voltage slightly lower than the mirror voltage Vm as the reference voltage VrefM in order to detect the timing when the gate voltage Vg of the IGBT 1 shifts to the mirror period.

The comparator 81 outputs a high level gate detection signal SgM to the control circuit 10 when the gate voltage Vg of the IGBT 1 reaches the reference voltage VrefM. Further, it is assumed that the gate detection signal Sg detected by the gate voltage detection circuit 30 corresponding to the gate detection signal SgM of the gate voltage detection circuit 80 is output as the gate detection signal SgU.

The level of the gate voltage Vg detected by the gate voltage detection circuit 80 may not be limited to a value for detecting the mirror voltage Vm, alternatively, may be a value for setting the reference voltage VrefM in order to detect the voltage with the middle level at which the gate voltage Vg is shifted to the on state.

In this configuration, the control circuit 18 instead of the control circuit 10 receives the preset on-drive command signal Sonx, the on-drive time set value Tons1, the on-drive time set value Tons2, the gate detection signal SgM, and the gate detection signal SgU. Further, the control circuit 18 sets the on-drive timing from the on-drive command signal Sonx, outputs the on-drive signal Son to the gate drive circuit 20, and outputs the drive performance at the time of on-drive as the drive performance adjustment signal Sdx to the gate drive circuit 20.

The control circuit 18 outputs the drive performance during the on drive as the drive performance adjustment signal Sdx according to the comparison result by comparing the first on-drive time Ton1, from the output timing of the high-level on-drive signal Son until the gate voltage Vg reaches the reference voltage VrefM and the gate detection signal SdM is input, with a preset first on-drive time set value Tons1.

In addition, the control circuit 18 outputs the drive performance from the time when the gate voltage Vg reaches the reference voltage VrefM as the drive performance adjustment signal Sdx according to the comparison result by comparing the second on drive time Ton2, from the timing when the gate detection signal SgM is input until the gate detection signal SgU is input, with a preset second on-drive time set value Tons2.

That is, the drive performance set by the control circuit 18 is configured to be set by adjusting each of the first on drive time Ton1 and the second on drive time Ton2. As a result, the IGBT 1 can be turned on with the optimum on-drive time Tons while protecting against the surge voltage.

Next, a specific control operation will be described with reference to FIGS. 19 and 20.

When the on-drive command signal Sonx is input, the control circuit 18 sets the drive performance determined at the time of the previous switching operation as the drive performance adjustment signal Sdx, and sets the on-drive timing as a high level on drive signal Son at time t0 to input it to the gate drive circuit 20. As a result, the gate drive circuit 20 supplies a constant current to the gate of the IGBT 1 based on the input drive performance adjustment signal Sdx to charge the gate, thereby increasing the gate voltage Vg of the IGBT 1.

When the gate voltage Vg of the IGBT 1 rises and exceeds the reference voltage VrefM of the gate voltage detection circuit 80, it is detected by the gate voltage detection circuit 80 and the gate detection result is transmitted to the control circuit 18 as a high level gate detection signal SgM.

The control circuit 18 sets the drive performance during the on drive by comparing the on-drive time Ton1 from the on-drive timing to the detection of the reference voltage VrefM according to the gate voltage Vg with a preset on-drive time set value Tons1. In this case, when the on-drive time Ton1 is longer than the on-drive time set value Tons1, the drive performance adjustment signal Sdx is set so as to increase the drive performance over the previous switching operation. When the on-drive time Ton1 is shorter than the on-drive time set value Tons1, the drive performance is lowered from the previous switching operation.

Further, when the gate voltage Vg exceeds the reference voltage VrefM, the control circuit 18 inputs the drive performance determined by the previous switching operation to the gate drive circuit 20 as the drive performance adjustment signal Sdx.

Since the gate drive circuit 20 charges the gate of the IGBT 1 based on the input drive performance, the gate voltage Vg further increases. When the gate voltage Vg exceeds the reference voltage VrefU, gate detection is performed by the gate voltage detection circuit 30, and the gate detection result is transmitted to the control circuit 18 as a high-level gate detection signal SgU.

Regarding the drive performance when the reference voltage VrefM for gate detection is exceeded, the control circuit 18 increases the drive performance when the reference voltage VrefM for gate detection is exceeded, from the previous switching operation when the on drive time Ton2 is larger than the second on drive time set value Tons2 by comparing the on drive time Ton2 from the time when the gate detection signal SgM is input until the reference voltage VrefU for gate detection is detected, with the pre-set second on-drive time set value Tons2. When the on-drive time Ton2 is shorter than the second on-drive time set value Tons2, the drive performance when the reference voltage VrefM is exceeded is reduced compared to the time of the previous switching operation.

Thus, by setting the on-drive time Ton1 and the on-drive time Ton2, respectively, the switching loss and the surge voltage can be optimally set.

FIG. 20 shows how the gate voltage Vg changes from time t6 to t8 shown in FIG. 19. In the drawing, the on-drive time Ton1 after the gate voltage Vg is turned on at time t0 until it reaches the reference voltage VrefM.

Is compared with the first on-driving time set value Tons1, so that it functions as the region Z1 for mainly determining the surge voltage of the IGBT 1. Also, the on drive time Ton2 from time t1 until the gate voltage Vg reaches the reference voltage VrefU is compared with the second on drive time set value Tons2, so that it functions as a region Z2 that mainly determines the switching loss.

According to this embodiment, the gate voltage detection circuit 30 that detects the gate voltage Vg with the reference voltage VrefU at the on drive level and the gate voltage detection circuit 80 that detects the gate voltage Vg with the reference voltage VrefM at the middle level are provided. The control circuit 18 compares using the first on-drive time set value Tons1 and the second on-drive time set value Tons2, thereby setting the drive performance of the gate drive circuit 20 in two stages. Thus, each of the surge voltage and the switching loss can be individually controlled.

In the above-described embodiment, an example of the configuration in which the gate voltage detection circuit 80 is added to the configuration of the first embodiment is shown, alternatively, the configuration may not be limited to this feature, and may be combined with the configuration of other embodiments.

Other Embodiments

The present disclosure should not be limited to the embodiments described above. Various embodiments may further be implemented without departing from the scope of the present disclosure, and may be modified or expanded as described below.

In the above embodiments, the first embodiment shows one IGBT driven, and the second embodiment shows two IGBTs driven, alternatively, three or more IGBTs may be driven. It can also be configured to drive two or more IGBTs in other embodiments.

Further, in each of the above-described embodiments, the case of applying to the IGBT as a gate-driven switching element has been shown, alternatively, the present embodiments may not be limited to these features, and may be applied to MOS transistors, MOS transistors using SiG, other gate-driven switching elements or the like.

In the above-described embodiments, the first to fourth embodiments show the embodiments of the configuration in which the IGBT 1 is controlled to on-drive, and the fifth to the seventh embodiments show the embodiments of the configuration in which the IGBT 1 is controlled to off-drive. By combining these, it is also possible to have a configuration that includes both the configuration for on-drive control and the configuration for off-drive control.

Further, in each of the above-described embodiments, the gate drive circuit configured to drive the gate of the IGBT 1 with a constant current is shown as the gate drive circuit. Alternatively, it may not be limited to this feature. It may be configured to drive the gate in other methods.

Further, in the above-described fourth embodiment, an example of a configuration in which the configuration of the third embodiment is combined with the configuration of the first embodiment has been described. A configuration obtained by combining the configuration of the first embodiment or other embodiments with the configurations of the temperature detection circuit in the eighth embodiment and the power supply voltage detection circuit of the ninth embodiment can also be used.

It is noted that a flowchart or the processing of the flowchart in the present application includes sections (also referred to as steps), each of which is represented, for instance, as S100. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A gate drive device for driving at least one gate-drive type switching element, the gate drive device comprising:
   at least one gate drive circuit that drives at least one gate of the at least one gate-drive type switching element based on a gate drive signal and a drive performance adjustment signal for setting a gate drive performance;
   at least one gate voltage detection circuit that outputs an on detection signal or an off detection signal when detecting that a gate voltage of the at least one gate-drive type switching element reaches an on determination set value or an off determination set value; and
   at least one control circuit that outputs the drive performance adjustment signal to the at least one gate drive circuit to match a gate drive time, from when instructing an on drive or an off drive of the gate with the gate drive signal to when outputting a detection signal of the on drive or the off drive from the at least one gate voltage detection circuit, with a predetermined gate drive time set value.

2. The gate drive device according to claim 1, further comprising:
a current detection circuit that detects a current of the at least one gate-drive type switching element, wherein:
the control circuit adjusts the predetermined gate drive time set value to be larger when the current of the at least one gate-drive type switching element is larger than a predetermined level and to be smaller when the current of the at least one gate-drive type switching element is smaller than the predetermined level in a process for outputting the drive performance adjustment signal to the at least one gate drive circuit to match the gate drive time with the predetermined gate drive time set value.

3. The gate drive device according to claim 1, further comprising:
a temperature detection circuit that detects a temperature of the at least one gate-drive type switching element, wherein:
the control circuit adjusts the predetermined gate drive time set value according to the temperature of the at least one gate-drive type switching element detected by the temperature detection circuit in a process for outputting the drive performance adjustment signal to the at least one gate drive circuit to match the gate drive time with the predetermined gate drive time set value.

4. The gate drive device according to claim 1, further comprising:
a power supply voltage detection circuit that detects a power supply voltage applied to the at least one gate-drive type switching element, wherein:
the control circuit adjusts the predetermined gate drive time set value according to the power supply voltage detected by the power supply voltage detection circuit in a process for outputting the drive performance adjustment signal to the at least one gate drive circuit to match the gate drive time with the predetermined gate drive time set value.

5. The gate drive device according to claim 1, further comprising:
at least one gate voltage detection circuit that outputs a middle level detection signal when detecting that a gate voltage of the at least one gate-drive type switching element has reached a determination set value of a mirror voltage level, wherein:
the control circuit outputs the drive performance adjustment signal to the gate drive circuit to match a gate drive time, from when instructing an on drive or an off drive of the gate with the gate drive signal to when the gate voltage detection circuit outputs the middle level detection signal, with a predetermined first gate drive time set value; and
the control circuit outputs the drive performance adjustment signal to the gate drive circuit to match a gate drive time, from when the gate voltage detection circuit outputs the middle level detection signal to when the gate voltage detection circuit outputs a detection signal of the on drive or the off drive, with a predetermined second gate drive time set value.

6. The gate drive device according to claim 1, wherein:
the gate drive circuit drives the gate of the at least one gate-drive type switching element with a constant current.

7. The gate drive device according to claim 1, wherein:
the gate drive circuit performs an on drive of the at least one gate-drive type switching element.

8. The gate drive device according to claim 1, wherein:
the gate drive circuit performs an off drive of the at least one gate-drive type switching element.

9. The gate drive device according to claim 1, wherein:
the gate drive circuit performs an off drive and an off drive of the at least one gate-drive type switching element.

* * * * *